United States Patent [19]
Soyama

[11] Patent Number: 5,575,610
[45] Date of Patent: Nov. 19, 1996

[54] TRANSPORT-BY-SUCTION TYPE DIE

[75] Inventor: Hideki Soyama, Nagano, Japan

[73] Assignee: Apic Yamada Corporation, Nagano, Japan

[21] Appl. No.: 352,103

[22] Filed: Nov. 30, 1994

[30] Foreign Application Priority Data

Nov. 30, 1993 [JP] Japan .................. 5-299903

[51] Int. Cl.$^6$ ...................... B21J 13/08
[52] U.S. Cl. ............ 414/750; 414/752; 198/468.4
[58] Field of Search .............. 414/750, 752; 198/468.4

[56] References Cited

U.S. PATENT DOCUMENTS

| | | | |
|---|---|---|---|
| 4,064,917 | 12/1977 | Diaz | 140/105 |
| 4,807,456 | 2/1989 | Shiraishi et al. | 198/468.4 |
| 5,072,823 | 12/1991 | Takahashi et al. | 198/468.4 |
| 5,140,839 | 8/1992 | Bruns | 198/468.4 |

FOREIGN PATENT DOCUMENTS 0222401  5/1987  European Pat. Off. .

Primary Examiner—Karen B. Merritt
Assistant Examiner—Gregory A. Morse
Attorney, Agent, or Firm—Sughrue, Mion, Zinn, Macpeak & Seas

[57] ABSTRACT

A transport-by-suction type die for use in a working machine having working stages, the die comprises a feed arm mounted in a position above the working stage in a lower part of the die to be slidable in the direction of consecutive feed and to be vertically movable with respect to a surface of the working stage; suction pads for supporting a piece part by suction, the suction pads being attached to the feed arm at the same interval as that of the working stages; a negative-pressure aspiration mechanism connected with each of the suction pads; and a drive control mechanism for causing the feed arm to move vertically and reciprocate in synchronism with working processes.

3 Claims, 12 Drawing Sheets

TRANSPORT-BY-SUCTION TYPE DIE

BACKGROUND OF THE INVENTION

1. Field of the Invention

The present invention relates to a transport-by-suction type die for use in a lead working machine useful in the fabrication of semiconductor devices.

2. Discussion of the Related Art

The fabrication of plastic-molded semiconductor devices includes the steps of placing semiconductor chips on to leadframes, molding them with plastics and performing the necessary working processes such as resin removal, dam bar cutting, lead tip cutting and lead forming. The lead working machine is used at this post-die-processing stage to perform lead forming and various other working steps.

The lead working machine is usually operated with more than one die. The working operation is performed in two different ways: in one case, the leadframe is worked or operated on as it is transported in a strip form and piece parts are separated from it at the final stage and in the other case, lead cutting and dam bar cutting are first conducted and then the product portions are separated as piece parts from the leadframe and transported to the bending step. The primary reason for adopting these two different methods of transport is as follows: in the case where the leadframe is transported in a strip form, a simple transport apparatus will do since the top and bottom rails of the leadframe can be utilized as transport guides; however, with product portions that are not suspended from the top and bottom rails by means of hanger pins (i.e., pinch leads for suspending the packages) or with products that are suspended by means of hanger pins but which may drop during transport owing to the insufficient strength of the pins, transport of the leadframe for bending or otherwise working the leads is sometimes impossible unless it is separated into piece parts.

FIGS. 19, 20 and 21 are illustrations showing the layout of a prior art lead working machine. FIG. 19 shows an apparatus that performs working processes up to the bending stage as a leadframe in a strip form is fed consecutively with pins inserted into the rail holes in the leadframe. In this apparatus, the leadframe generally indicated by 5 is worked as it is supplied from the left side of the apparatus into a first die 7 and a second die 8 on a platform 6. A feed unit 10 which allows the leadframe to be fed consecutively with pins inserted into the rail holes is positioned parallel to the train of dies. In the final step following the bending process, piece parts 11 are separated from the product, transported from the second die and replaced in a receiving portion 12. The unwanted frame which remains after the separation of piece parts 11 is directly ejected from the second die to fall free. Depending on the relationship between the number of working processes and the number of chips on the leadframe, three or more dies may be arranged side by side for working the leads.

The working machine shown in FIG. 19 is useful with DIP, ZIP, SOJ, PLCC and all other products that have hanger pins. It is particularly suitable for use with TSOPs which are difficult to effect precise positioning with reference to the lateral sides of thin packages into which the leadframe has been separated.

FIG. 20 shows a working machine that has a first die 7 and a second die 8 arranged in a direction normal to the supply of the leadframe 5. In the first die 7, the leadframe is transported as it is while working processes such as dam bar cutting and lead tip cutting are effected and, at the final stage, the leadframe piece parts are separated from the leadframe; the piece parts then leave the first die 7 in an orthogonal direction and enter the second die 8, through which the piece parts are fed consecutively for further working. In the second die 8, the piece parts are fed consecutively by sliding over the die by means of a feed bar 14 so that the leads are bent successively and thereafter replaced in the receiving portion 12. The unwanted frame 15 is directly ejected from the first die 7. A feed bar transport unit 16 is located parallel to the second die 8.

The working machine shown in FIG. 20 is useful with DIP, ZIP, SOJ, SOP and other products that have outer leads attached in one or two directions. Because of the structural design of the bending die, this type of working machine allows for precise positioning by lateral movement and, hence, it is especially suitable for use with SOP and SOJ.

FIG. 21 shows a case in which the leadframe is transported through a first die 7 as it is while working processes such as dam bar cutting and lead tip cutting are effected and, at the final stage, piece parts 11 are separated from the leadframe; thereafter the piece parts 11 emerge from the first die 7 in a direction normal to the transport through said die and they are successively transported by suction to pass through a second die 17, a third die 18 and a fourth die 19 for working the leads. For transporting the piece parts 11 between successive dies, a suction transport unit 20 is provided parallel to the second die 17, third die 18 and fourth die 19. The apparatus shown in FIG. 21 requires as many dies as the steps of the bending process.

The working machine shown in FIG. 21 is useful with QFP, PLCC and other products that have outer leads attached in four directions. It is particularly suitable for use with QFP and PLCC which are large packages that may drop while they are transported when engaged by means of hanger pins.

As described above, the conventional lead working machines have a plurality of die units set in such a way that the work is transported from one die to the next during consecutive working. In the case shown in FIG. 21, piece parts are separated from the leadframe in the first die and, thereafter, each part 11 is supported by suction and successively transported to dies 17, 18 and 19 for performing the necessary working processes.

This method of transport by suction is used with semiconductor products that are large packages and which may drop while they are transported when engaged by means of hanger pins. Conventional working machines that rely upon transport by suction have a suction transport unit 20 on the side lateral to the train of dies (see FIG. 21) so that each piece part is moved from one die and replaced on the next die. The transport unit 20 has feed arms that are located in the retracted positions lateral to the dies 17, 18 and 19 and which get into the space between dies in each working process to transport the piece part. Therefore, the conventional working machines must use different dies for different working processes and the suction transport unit 20 is installed to match these dies.

Under these circumstances, setting dies in the conventional working machines has been cumbersome or the need has existed to manufacture dies to different specifications. Other problems that have been encountered are as follows: If many die units are to be used, the number of feed arms will increase and the inevitable increase in the weight of the moving parts will limit the efforts to increase the indexing speed; the feed arms in the conventional working machine is cantilevered, so if they are moved at higher speeds, their tip will vibrate and the product which is being set in a working die cannot be placed into a pocket precisely and this occasionally results in a broken product or a damaged dies; to increase the indexing speed with the conventional working machine, the posts on the side where the feed arms are provided are omitted, thereby insuring the reciprocal movements of the feed arms but, then, the mounting strength of the upper and lower parts of each die is insufficient to insure satisfactory positional precision; and the strokes of the upper and lower parts of each die will increase to prevent the efforts to increase the indexing speed in an effective way.

SUMMARY OF THE INVENTION

The present invention has been accomplished under these circumstances, and therefore an object of the invention is to provide a transport-by-suction type die that is capable of effective increase in indexing speed, that is compact enough to facilitate die manufacture, and that is convenient to use.

This object of the invention has been achieved by provision of a transport-by-suction type die which sucks the work as a piece part and which works it as it is fed consecutively, characterized in that a guide mechanism for supporting said piece part is provided on the die in such a way that it is capable of moving back and forth in the direction of consecutive feed and that it is capable of vertical movement to approach or depart from the die surface.

In one embodiment of the invention, a feed arm is mounted in a position above the working stage in the lower part of the die in such a way that it is slidable in the direction of consecutive feed and that it is capable of vertical movement with respect to the surface of the working stage, and said feed arm is provided with suction pads for supporting the piece part by suction at the same interval as that of said working stages, and each suction pad is connected to a negative-pressure aspiration mechanism, and a drive control mechanism is provided that causes said feed arm to move vertically and reciprocate in synchronism with working processes.

In another embodiment of the invention, said feed arm has the suction pads provided on support plates that will be positioned in space areas between adjacent working stages that will not interfere with the working operation.

In yet another embodiment of the invention, said feed arm is formed as a frame-like element that has rectangular openings in areas that will correspond to the working stages during a working process and the support plates of the feed arm will be positioned in space areas between adjacent working stages that will not interfere with the working operation.

In a further embodiment of the invention, said feed arm is allowed to move back and forth in the direction of consecutive feed by means of a feed drive mechanism exterior to the die.

In a still further embodiment of the invention, said feed arm has a sub-arm that extends toward the opposite side of the lower part of the die, and said arm is supported by a guide in a direction parallel to the direction of consecutive feed and on a lateral surface of the opposite side of the lower part, and said arm is provided with a butt block that is to be pushed by means of said feed drive mechanism exterior to the die so as to reciprocate said feed arm by means of said feed drive mechanism.

The transport-by-suction type die of the invention is characterized in that a guide mechanism that supports by suction a piece part a the work and which feeds it consecutively over the die is provided on the die in such a way that it is capable of moving not only back and forth but also vertically. This arrangement enables the realization of a compact die layout including the mechanism for transporting piece parts and provides an effective means for increasing the speed of indexing in the consecutive feeding of piece parts.

The drive control mechanism insures that the feed arm furnished with suction pads is moved not only back and forth but also vertically in conformity with the layout of the working stages, whereby the piece part on each working stage is fed consecutively to the next stage.

When working piece parts, the support plates are moved to space areas between working stages that will not interfere with the working operation and this enables the individual piece parts to be worked with the feed arm kept positioned on the die surface, rather than retracted to the outside of the die.

Since the feed arm is moved back and forth over the die, the die design can be made common to various product types without undue complexity.

BRIEF DESCRIPTION OF THE DRAWINGS

The present invention will be described in more detail with reference to the accompanying drawings, in which.

DETAILED DESCRIPTION OF THE PREFERRED EMBODIMENTS

A transport-by-suction type die applied to general-purpose lead working machine according to embodiments of the present invention will be described below in more detail with reference to the accompanying drawings.

General Layout of the Machine

Figure 1:
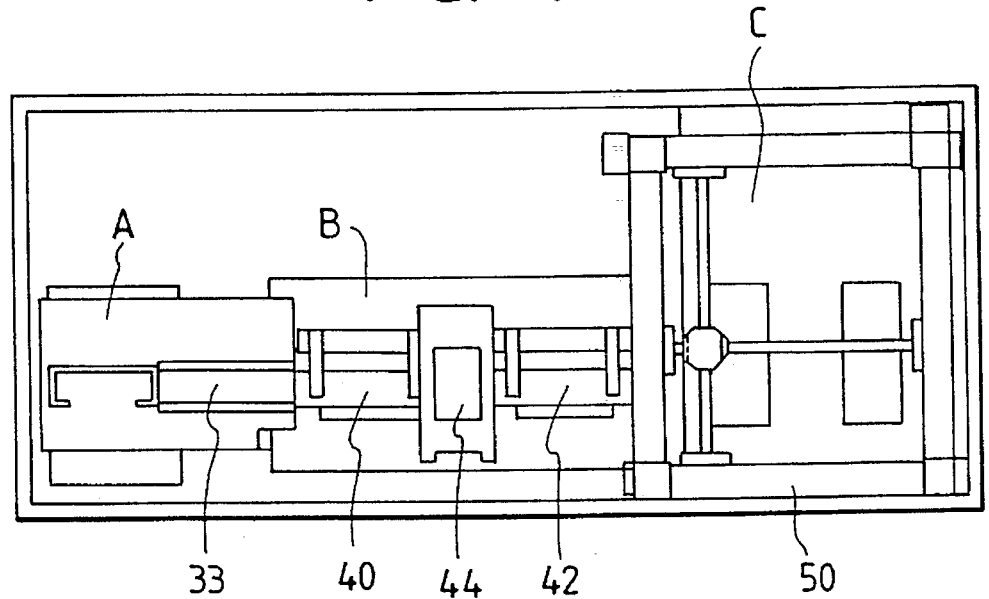
FIG. 1 is an illustration showing the layout of various parts of the general-purpose lead working machine of the invention as it is seen from above.
Figure 2:
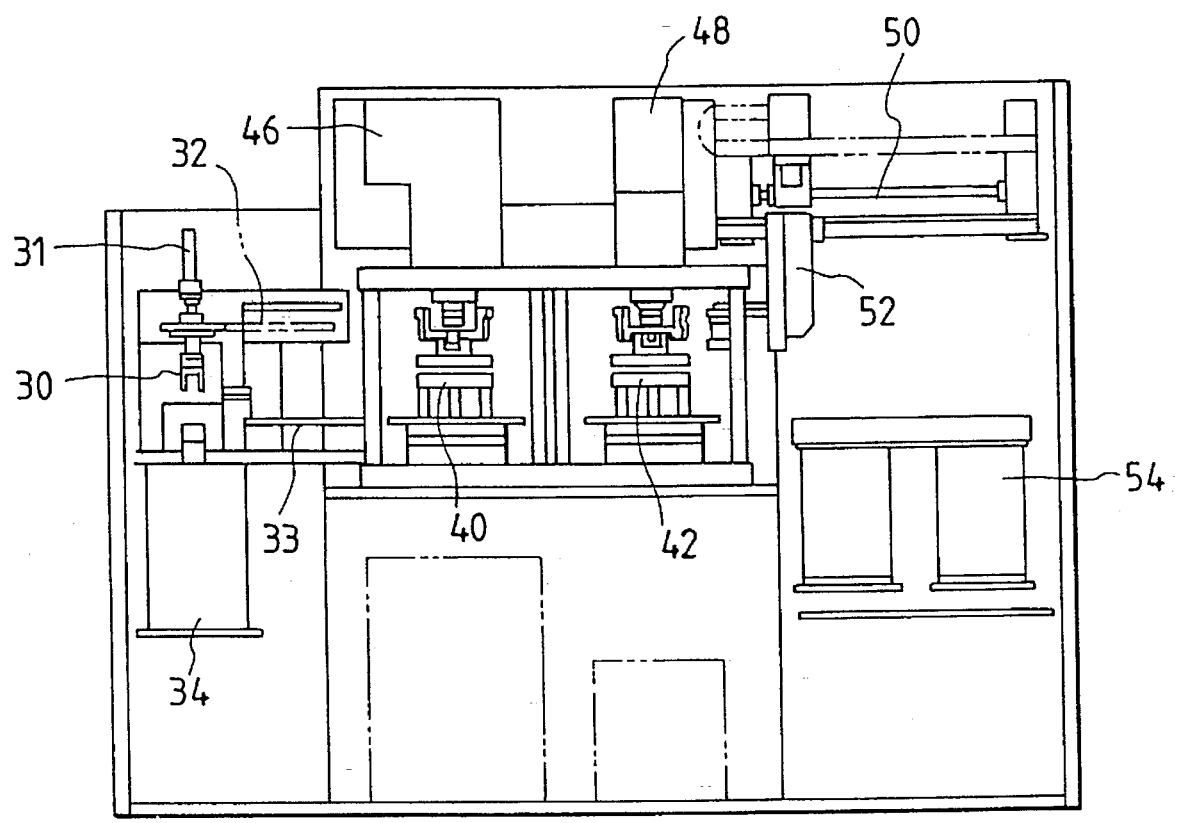
FIG. 2 is an illustration showing the layout of various parts of the general-purpose lead working machine of the invention as it is seen from the front.

FIGS. 1 and 2 are illustrations showing the general layout of the lead working machine used in the invention. FIG. 1 is a top view and FIG. 2 is a front view. The working machine of the embodiment under consideration consists basically of a leadframe supply mechanism portion A for supplying a plastic-molded leadframe to working stages, a working stage portion B for working the leadframe, and a receiving mechanism portion C for receiving the worked product.

The leadframe supply mechanism portion A, the working stage portion B and the receiving mechanism portion C are arranged in a row and the work is supplied from A to B, where it is subjected to the necessary working processes and the worked products are received in C.

In the leadframe supply mechanism portion A, plastic-molded leadframes stacked in a magazine are chucked one by one and replaced in a predetermined position in the working stage portion B. The leadframes in the magazine are pushed up with a lifter under the magazine in synchronism with the chucking action and are thereafter supplied successively to the working stage portion B, with the topmost leadframe supplied first and the underlying frame supplied next.

Referring to FIG. 2, numeral 30 designates the chuck, 31 a cylinder for vertically moving the chuck 30, 32 a belt for moving the chuck 30 laterally or horizontally, 33 a pair of rails along which the leadframe is moved for replacement, and 34 a magazine support.

Since the length and width of the leadframes depend on the product to be yielded, the magazine for accommodating the leadframes also varies in size. To insure flexible use for magazines of varying sizes, the leadframe supply mechanism portion A of the embodiment under consideration permits the magazine to be set in such a way that the centers of the width and length of each leadframe in the magazine coincide in position with the center of the chuck 30 and, at the same time, the supply mechanism portion A is so adapted that each leadframe can be moved for replacement along the rails 33 as it is chucked in the central position. The distance between the rails 33 is variable with the width of each leadframe and the latter can be supplied to the working stage portion B with the position of the center of the width of the leadframe being used as a reference point.

In the working stage portion B, the leadframe as supplied from the supply mechanism portion A is subjected to the predetermined working processes as it is fed consecutively on the respective working stages. In the embodiment under consideration, the first die 40 is positioned closer to the leadframe supply end and the second die 42 is positioned a certain distance away from the first die 40. The first die 40 and the second die 42 are set in a press unit in the free-shank fashion so that they can be independently mounted or dismounted from the press unit. The two dies are fabricated individually to the specifications of the products to be yielded and in order to enable common setting in the single press unit, the die design including such aspects as height and other dimensions is made common to the two dies as they set in the press unit. The first die 40 and the second die 42 to be set in the press unit may be of either the type that permits the leadframe to be worked as it is fed consecutively in a strip form or the type that permits piece parts to be worked as they are fed consecutively. The structural design that enables either type of dies to be set in the press unit will be described later in this specification.

To insure that working is performed irrespective of whether the work being fed consecutively is the leadframe in a strip form or piece parts which have been separated from the leadframe, the working stage portion B of the embodiment under consideration includes the following three members which are positioned intermediate between the first die 40 and the second die 42: a rail mechanism for transferring the leadframe to the second die 42, an ejector chute 44 into which unwanted frame is ejected from the first die 40, and a pickup mechanism by which the piece parts that have been separated from the leadframe in the first die 40 are moved and replaced on the second die 42.

Referring to FIG. 2, numerals 46 and 48 are press subunits for driving the first die 40 and the second die 42, respectively.

The products that are ejected after the predetermined working processes have completed in the working stage portion B are successively placed into receiving trays in the receiving mechanism portion C. In the embodiment under consideration, an X-Y drive stage 50 supports by suction the products being ejected from the second die 42 and replaces them in the receiving tray. Referring to FIG. 2, numeral 52 designates a receiving pickup head as mounted on the X-Y drive stage 50, and 54 represents the receiving trays for receiving the ejected products. The receiving trays 54 are set in the working machine as they are stacked in carriers and the individual products are replaced in alignment by means of the X-Y drive stage 50 as they are set one by one in the receiving position.

As described above, the lead working machine of the embodiment under consideration comprises the leadframe supply mechanism portion A, the working stage portion B and the product receiving mechanism portion C as they are arranged in tandem in such a way that the work is subjected to the necessary working processes as it is transported linearly from the position where it is supplied to the portion A up to the position where the worked product is taken up from the portion B. Because of this arrangement, the lead working machine is compact and convenient to use since all handling procedures such as setting the work in the dies, mounting the dies and dismounting them can be effected on the side of the machine that faces the operator. The lead working machine of the embodiment under consideration is basically intended for working leadframe strips but it should be understood that the working stage portion B is also applicable to a hoop of leadframe or piece parts with minimum alterations being made to the supply and receiving ends of the machine.

Layout of the Working Stage Portion

The general-purpose lead working machine of the embodiment under consideration has the first die 40 and the second die 42 arranged in tandem and it is adapted to be capable of selective working regardless of whether the leadframe as the work is fed consecutively or whether piece parts that have been separated from the leadframe are fed consecutively. This is made possible by the special layout of the working stage portion B, which is described below in detail.

Figure 3:
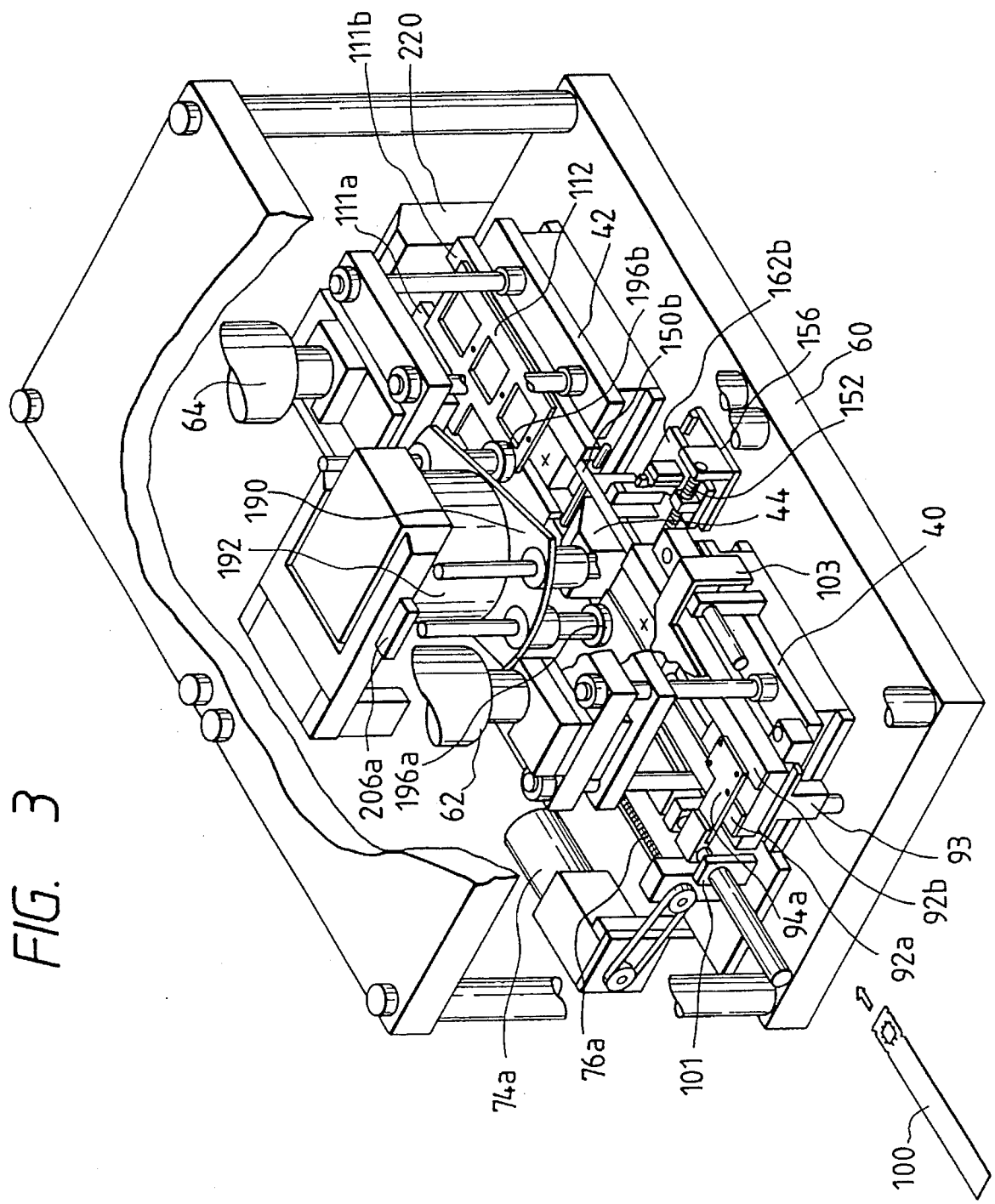
FIG. 3 is a perspective view of the working and handling portion of the machine.

FIG. 3 is a perspective view of the working stage portion B. The first die 40 and the second die 42 are set on the base 60 of the press unit and are brought into engagement with independently driven press rams 62 and 64, respectively, in a free-shank fashion. If the first die 40 and the second die 42 are inserted into the machine from the side facing the operator and thereafter pushed to slide over the base 60 toward the other side of the machine, the dies are brought into engagement with the rams 62 and 64, respectively, so that they are in the driven state. The as-set die dimensions and the position of the height of the engagements with the press rams 62 and 64 are rendered to be common to the two dies, so that die units including the worked products can be replaced and set, as required, in the working stage portion B.

The embodiment under consideration assumes that the first die 40 is capable of working the leadframe as it is fed consecutively whereas the second die 42 is capable of working piece parts as they are fed consecutively. Each of the first die 40 and the second die 42 has a plurality of working stages and the work is fed consecutively to the respective working stages for effecting the necessary working processes. The work can be transported by either one of the following three methods: the leadframe is fed consecutively by means of a feed arm furnished with feed pins; piece parts are fed consecutively as they are sucked with suction pads; and piece parts are fed consecutively as they are placed in pockets in a feed bar.

The feed arm allows the leadframe to be fed in given increments as it moves back and forth by one pitch on each working stage. When transporting the leadframe, exact positioning is inserted by inserting feed pins into the holes made in the rails of the leadframe. In the other cases of transport, i.e., the case where piece parts are held with suction pads and the case where they are placed in the pockets in the feed bar, the piece parts are fed consecutively through incremental movements by one pitch.

The pitch of feed on the dies varies with the type of product to be yielded, so in order to insure that the working machine can be used for various types of dies, feed by the required pitch must be realized for every die that is set on the machine. To this end, the embodiment under consideration is so designed that feed arms and other moving parts for use in the transport of the work are provided on the dies in accordance with the dimensional sizes of the product whereas a feed drive mechanism for reciprocating these moving parts is provided on the main body of the machine.

Work Feed Drive Mechanism

Figure 4:
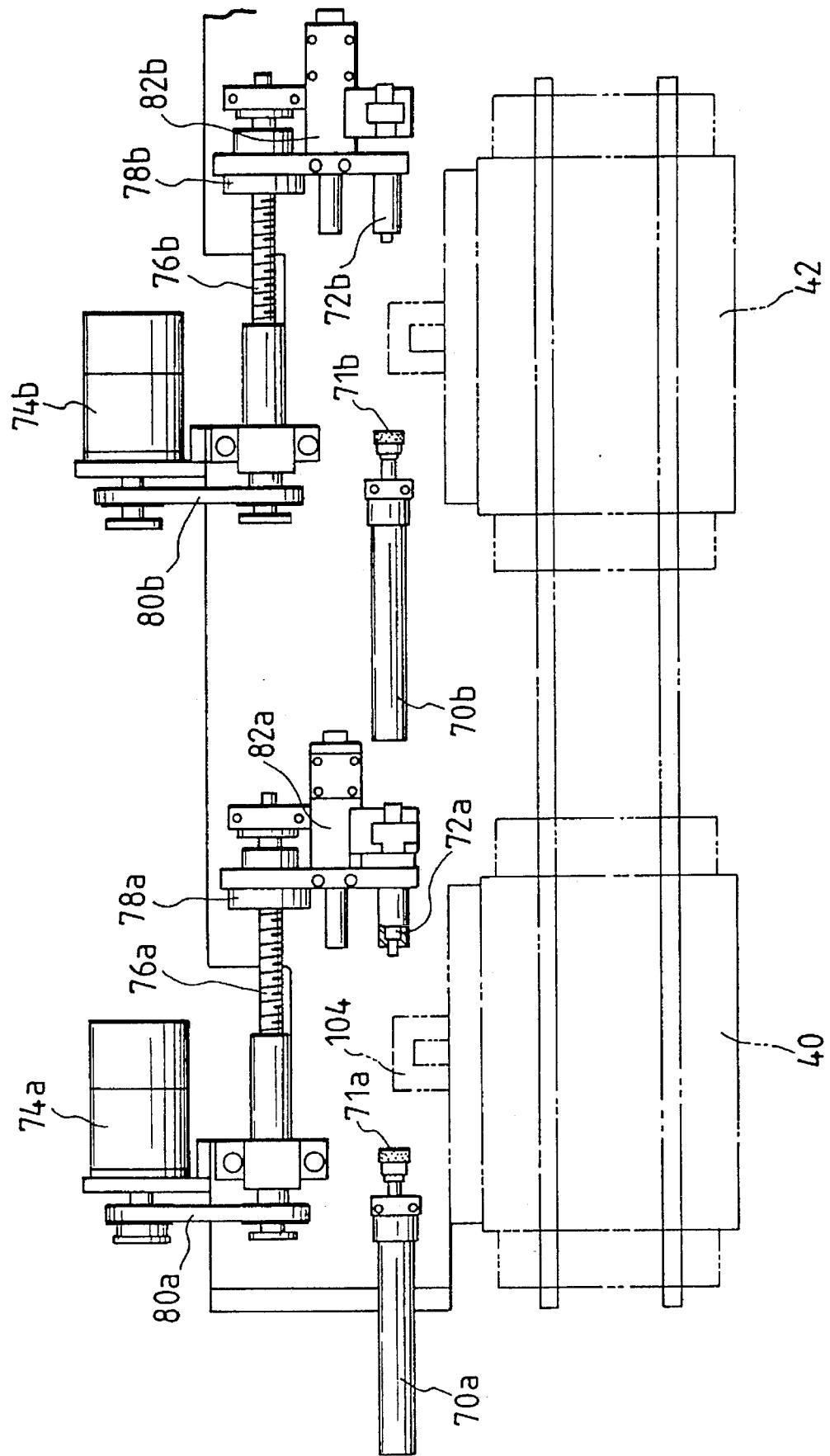
FIG. 4 is an illustration showing the construction of the feed drive mechanism provided in the main body of the machine.

FIG. 4 shows the feed drive mechanism as it is mounted on the base 60. To be more exact, the feed drive mechanism consists of two independent units for the first die 40 and the second die 42, respectively. To insure common use with various dies that depend on transport by different methods, the two units of feed drive mechanism have a common layout so that a desired die can be substituted and set in a predetermined position on each of the dies 40 and 42. The two units of feed drive mechanism as provided on the respective dies are controlled in such a way that they are driven in synchronism when in action.

To insure that the feed arm and other moving parts which are provided on the dies will reciprocate in a direction parallel to the transport of the work, the feed drive mechanism has a capability for pushing those moving parts both in a direction in which they are advanced parallel to the transport of the work and in a direction in which they are moved back.

Referring to FIG. 4, numerals 70a and 70b designate cylinders for pushing the moving parts on the first die 40 and the second die 42, respectively, to be moved in the advancing direction, and 72a and 72b are pushers that push the same moving parts in the retracting direction. The pushing rod of the cylinder 70a (or 70b) is positioned on the same height as the pusher 72a (or 72b) in a face-to-face relationship with the latter. The distal end of the pushing rod of the cylinder 70a (or 70b) is fitted with a pad 71a (or 71b) that provides a cushion effect for the moving parts when they are compressed into contact with the rod; the pushers 72a and 72b are designed as shock absorbers.

The pushers 72a and 72b are pushed as they are driven with motors in combination with ball screws. In FIG. 4, numerals 74a and 74b refer to motors, 76a and 76b are ball screws, and 78a and 78b are nuts that mesh with the ball screws 76a and 76b, respectively. The ball screw 76a (or 76b) is operatively associated with the motor 74a (or 74b) by means of a belt 80a (or 80b), and the nut 78a (or 78b) is coupled to the pusher 72a (or 72b) via a slide guide 82a (or 82b). The slide guide 82a (or 82b) helps move the pusher 72a (or 72b) in a direction parallel to the transport of the work. The ball screw 76a (or 76b) is provided in such a way that its axis is parallel to the slide guide 82a (or 82b).

As mentioned above, the work feed drive mechanism comprises drive means such as cylinders 70a and 70b, pushers 72a and 72b, and motors 74a and 74b. For consecutive feeding of the work, the feed arm and other moving parts are actuated by the cylinder 70a (or 70b) until they contact the pusher 72a (or 72b) which is controlled in position by means of the motor 74a (or 74b). This is how the work is controlled for feed.

To have the moving parts return to the initial position, the pusher 72a (or 72b) is driven by the motor 74a (or 74b) so that it is moved in the retracting direction. Thus, the work can be fed consecutively by actuating the cylinder 70a (or 70b) in association with the motor 74a (or 74b).

The feed drive mechanism used in the embodiment under consideration depends, for its operation, on the drive with motors using ball screws 76a and 76b. The advantage of driving the pushers 72a and 72b by driving with the ball screws 76a and 76b is that the positions of the pushers 72a and 72b can be controlled correctly in such a way that the work can be stopped in a correct position part of the way of transport. Stated more specifically, the position of the pusher 72a (or 72b) can be set by controlling the turn of the ball screw 76a (or 76b), so when advancing the moving parts on the dies by means of the cylinder 70a (or 70b), the work can be fed by increments which are fractions of the total range of transport by setting the pusher 72a (or 72b) to be positioned part of its stroke. The same can be accomplished in the return path of the pusher 72a (or 72b) and they can be positioned part of their stroke.

Exemplary Layout of the First Die

Figure 5:
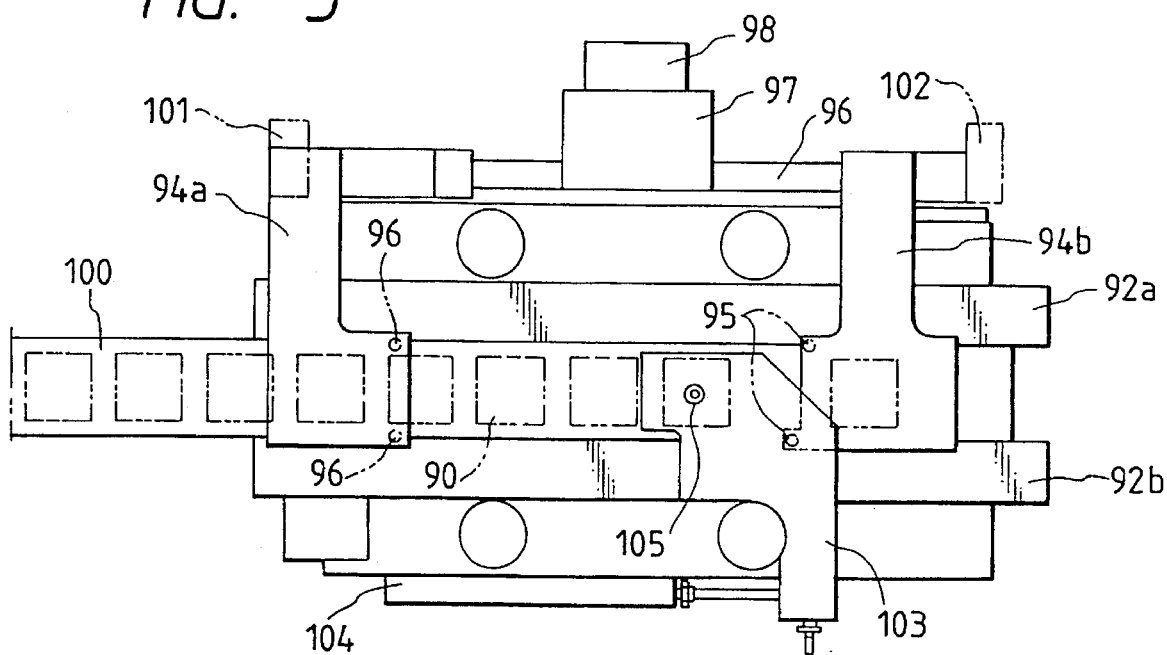
FIG. 5 is a plan view showing the structure of the first die.

FIG. 5 is a plan view of the lower part of the first die 40. The cavity surface of this lower part is provided with a plurality of working stages 90. The lower part is also provided with a pair of feed plates 92a and 92b that extend along both sides of each working stage 90 for transferring the leadframe as they guide the top and bottom rails of the latter. The plastic-molded leadframe 100 as the work is supplied from one end of the first die 40 in such a way that the edges of the top and bottom rails are inserted into grooves that extend over the entire length of the opposing inner lateral sides of the feed plates 92a and 92b. It should be noted here that a descending mechanism 93 is provided at both ends of the feed plate 92a (or 92b) and this forces the feed plate 92a (or 92b) to be pushed down during press working.

Shown by 94a and 94b are feed arms for causing the leadframe 100 to be fed consecutively on the lower part of the first die 40. To avoid interference with the working stages 90, the feed arm 94a is provided at the end where the leadframe 100 is admitted whereas the feed arm 94b is provided at the end where the leadframe 100 is ejected. The underside of the feed arm 94a (or 94b) is provided with erect feed pins 95 that face down in registry with the positions where holes are made in the top and bottom rails of the leadframe 100. When feeding the leadframe 100 consecutively, the feed pins 95 engage the holes in the top and bottom rails of the leadframe 100 and by transporting the leadframe in that way, it can be fed consecutively from one working stage 90 to the subsequent working stage in a correct manner.

The feed arms 94a and 94b are fixed to a connecting bar 96 with their spacing being set to an appropriate value for each product. A plate 97 for holding the arms horizontally is secured to the connecting bar 96 and supported by a slide guide that is fitted on the outer lateral surface of the lower part of the first die 40. The slide guide serves to guide the feed arms 94a and 94b via the plate 97 so that they will reciprocate in a direction parallel to the feed of the leadframe 100. Shown by 98 is a butt block that is provided in such a way that it projects from the outer lateral surface of the plate 97 to the deeper area of the machine. The block 98 is set in a position intermediate between the cylinder 70a and the pusher 72a (i.e., two elements of the work feed drive mechanism) and at the same height as these elements when the first die is set in a predetermined position on the base 60.

Shownby 101 is a stopper for restricting the retracted position of the feed arm 94a and 102 refers to a stopper for restricting the advanced position of the feed arm 94b. The stoppers 101 and 102 are provided on the lower part of the first die 40 in such a way that they will contact the outer lateral surfaces of those base positions of the feed arms. The motion of stoppers 101 and 102 may be regulated either by shaping them in a plate form or by designing them as shock absorbers. By thusly specifying the positions where the stoppers 101 and 102 are to be set, the requisite stroke of the feed arms can be set for each die. It should be added that in the presence of stoppers on the die, the feed drive mechanism may be somewhat rough in design without causing any significant problem.

The cylinder 70a and the pusher 72a which are two elements of the work feed drive mechanism will reciprocate the feed arms 94a and 94b by alternately pushing two end faces of the butt block 98 in opposing directions. The positions for the movement of the feed arms 94a and 94b are regulated by the stoppers 101 and 102, respectively, so that the arms can be fed in given increments in a correct way.

In the first die 40 used in the embodiment under consideration, the leadframe 100 is fed consecutively for the necessary working processes including resin removal, dam bar cutting and lead cutting and, thereafter, piece parts are separated from the leadframe. The separate piece parts are then moved for replacement on the second die 42. To this end, the first die 40 is fitted with a mechanism for sucking the piece parts and transporting them toward the second die 42.

In FIG. 5, numeral 103 refers to a delivery arm for supporting each piece part by suction and ejecting it toward the second die 42. The delivery arm 103 is supported as guided along the lateral surface of the lower part of the first die 40 that is the closer to the operator so that it will reciprocate in a direction parallel to the feed of the feed arms 94a and 94b in operative association with an air cylinder 104. The front end of the delivery arm 103 extends to a position above the final working stage in the lower part of the first die 40 where piece parts are separated from the leadframe; the arm 103 has a suction pad 105 provided on the top surface for pneumatically sucking an individual piece part by suction.

To avoid interference with the feed arm 94b on the ejection side, the delivery arm 103 is adapted to be capable of lateral movement slightly above the position in height of the arm 94b so that the piece part as supported by the arm 103 crosses over the arm 94b to get to the ejection side of the first die 40.

The upper part of the first die 40 is provided with a knock-out and a punch that help support the work between the upper and lower parts of the first die. The upper part of the first die is also furnished with a vertically movable rod as a means to insure that the piece part as separated from the leadframe 100 is supported by suction; the rod has an air channel formed in the interior with a suction pad fitted at the lower end.

The product that has been separated as a piece part from the leadframe in the final working stage of the first die 40 is sucked pneumatically by the suction pad fitted at the end of the rod on the upper part of the first die 40 and the product ascends temporarily together with the upper part. On the other hand, the unwanted frame is transported by the feed arms 94a and 94b toward the ejection side. As the upper part of the first die 40 ascends, the delivery arm 103 gets into the first die from the ejection side and it stops in a position just beneath the piece part supported by the upper part of the first die; thereafter, the rod on the upper part of the first die descends and releases the piece part, which is then sucked by the suction pad 105 on the delivery arm 103. The piece part as supported on the delivery arm 103 by suction is taken out of the first die 40 by moving the arm 103 in the advancing direction by means of an air cylinder 104.

The sequence of working actions that are taken by the first die 40 may be outlined as follows. When the feed plates 92a and 92b are assuming the UP position, or when the leadframe 100 as supplied from the left side of the first die 40 is slightly apart from the die surface, the feed pins 95 engage the holes in the top and bottom rails of the leadframe, which is fed consecutively by the pushing action of the feed arms 94a and 94b which is effected by the cylinder 70a which is part of the feed drive mechanism. In a predetermined feed position of the leadframe, the feed plates 92a and 92b are driven to descend and the intended press working is done between the upper and lower parts of the first die. While the press working is done, the feed arms 94a and 94b are driven by the ball screw 76a which is another part of the feed drive mechanism, so that those arms are moved back to their initial positions, thus becoming ready for the next transport step.

As described above, the leadframe 100 is fed consecutively over the working stages and piece parts are separated from the frame at the final stage. The separate piece parts are carried by the delivery arm 103 and taken out of the first die toward the ejection side, whereas the unwanted frame keeps moving over the lower part of the first die toward the ejection side, from which it is discharged from the system.

The first die 40 used in the embodiment under consideration is of such a type that piece parts are separated from the leadframe in the final working stage. If the die 40 is of such a type that the product portions are not separated as piece parts from the leadframe, the latter will be transported in the initial strip form toward the second die 42. This type of die is not furnished with the delivery arm 103 for taking the piece part out of the die or any mechanism for allowing the upper part of the die to hold the piece part by suction.

Exemplary Layout of the Second Die

Figure 6:
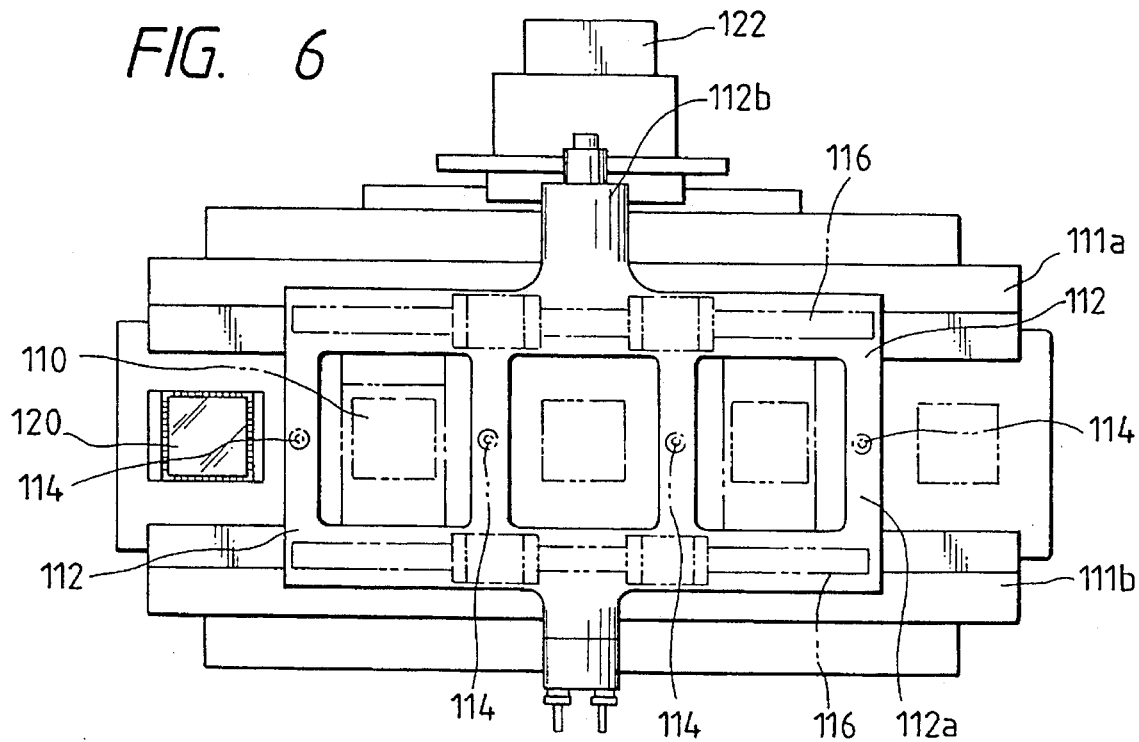
FIG. 6 is a plan view showing the structure of the second die.

FIG. 6 is a plan view of the lower part of the second die 42. Unlike the first die 40, the second die 42 is of such a type that piece parts as obtained by separating the product portions from the leadframe are fed consecutively one by one for working purposes, to which the transport-by-suction type die of the invention is applied.

Shown by 110 in FIG. 6 are working stages provided in the lower part of the second die. In the embodiment under consideration, three working stages are provided. With a die like the first die 40 which performs working on the leadframe that is transported as such, the transport of the work is guided by feed plates. The second die 42 is also furnished with feed plates 111a and 111b but these are simply driven in a vertical direction and will by no means guide the work.

A piece part 120 as supplied to the entrance of the second die passes through the successive working stages to be processed. Each working stage 110 carries one piece part 120 and all piece parts are supported simultaneously by suction with suction pads and transported to the adjacent working stages 110. To avoid any inconveniences to the working operation in each working stage 110, the second die used in the embodiment under consideration is provided with a frame-like feed arm 112 that has rectangular openings in areas that correspond to the working stages 110 and the arm 112 is fitted with suction pads 114 that enable the simultaneous transport of the piece parts 120.

The feed arm 112 has a sliding portion on either side across the width of each working stage 110 and this sliding portion guides the feed arm 112 so that it will reciprocate in a direction parallel to the transport of the piece part 120. Support plates 112a are provided in such a way that they span the opposing sliding portions and their underside is fitted with suction pads 114 that face down. In the embodiment under consideration, four support plates 112a are provided and each of them is fitted with one suction pad 114. The suction pads 114 are individually connected to a negative-pressure aspirator such as a vacuum generator, thereby suction-supporting the piece parts by negative pressure.

Figure 7:
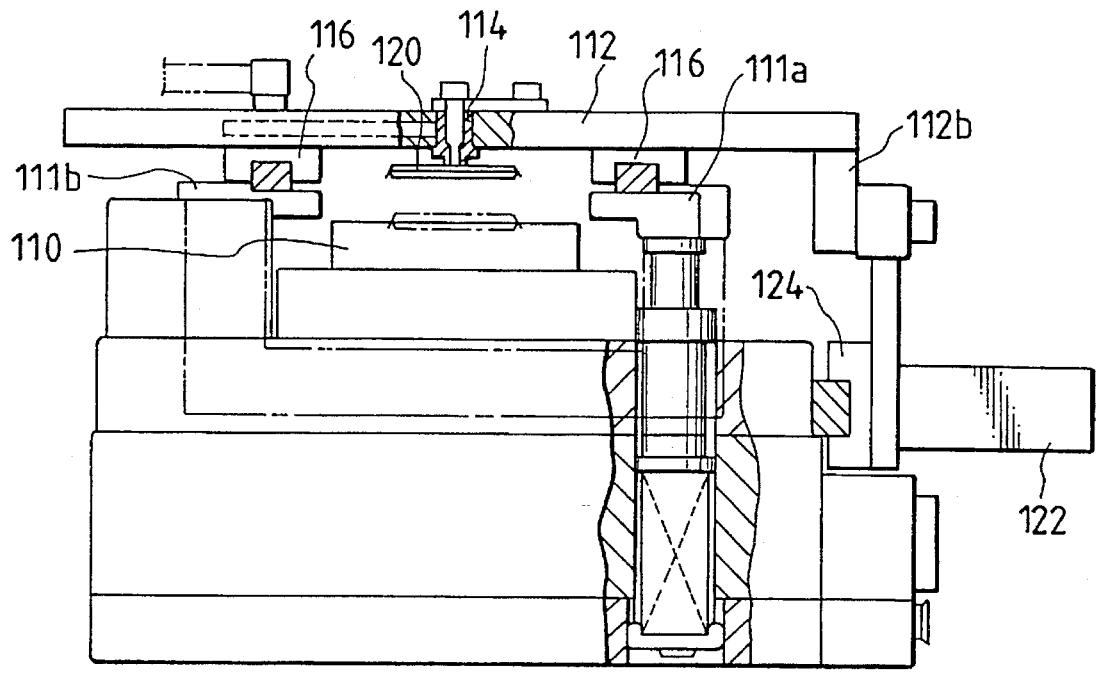
FIG. 7 is an illustration showing the portion where the feed arm is mounted on the second die.

The sliding portions of the feed arm 112 are supported by slide guides 116 that are provided on the feed plates 111a and 111b. FIG. 7 is a side view showing how the feed arm 112 is supported by the slide guides 116.

As in the case of the feed arms 94a and 94b fitted on the first die 40, the feed arm 112 is driven to reciprocate by means of a feed drive mechanism installed on the main body of the working machine. To this end, the feed arm 112 has a sub-arm 112b that extends away from the operator (toward the other side of the machine). At the same time, the end portion of the arm 112b extends downward along the outer lateral surface of the lower part of the second die and the lower end of the sub-arm 112b is fitted with a butt block 122 which faces outward. The butt block 122 is fitted in registry with the height of the cylinder 70b and the pusher 72b. For guided movement of the butt block 122, a slide guide 124 is fitted on the outer lateral surface of the lower part of the second die and it serves as a guide for supporting the butt block 122.

As shown in FIG. 7, the piece part 120 in the process of transport is sucked by suction pad 114 so that it is spaced by a certain distance from the surface of the working stage 110. When the piece part 120 moves to the subsequent working stage 110, the feed arm 112 descends and functions to replace the piece part 120 on that subsequent stage 110.

To permit these actions, the feed plates 111a and 111b are supported by the lower part of the second die in such a way that they are vertically movable; at the same time, the feed plates are operatively associated with a vertically driving mechanism so that they can move in the vertical direction. It should be mentioned here that the feed arm 112 which is supported by the slide guide 124 for lateral movement is also guided by slides that allow for vertical movements by means of engagement through dovetail grooves.

The feed arm 112 is moved forward when the cylinder 70b installed on the main body of the working machine contacts the lateral surface of the butt block 122 and pushes it in the advancing direction whereas the feed arm is moved backward when the pusher 72b also installed on the main body of the working machine contacts the lateral surface of the butt block 122 and pushes it in the retracting direction. Such forward and backward movements create the reciprocating action of the feed arm 112. Therefore, by using stoppers to restrict the range over which the feed arm 112 can move, the requisite feed stroke can be set for the specific product type so as to permit the feeding of the arm in the required increments.

The sequence of working actions that are taken by the second die 42 may be outlined as follows. First, the piece part 120 as the work is supplied to the lower part of the second die, whereupon the suction pad 114 in the farthest portion of the feed arm 112 moves back to the position that corresponds to the center of the top surface of the package of that particular piece part 120. The same is true with the piece parts 120 that are already at the respective working stages 110 and the suction pad 114 comes into registry with the central position of each piece part. With this registry kept, the feed plates 111a and 111b are lowered so that the individual piece parts 120 are sucked by suction pads 114. In the next step, the feed plates 111a and 111b are lifted and the feed arm 112 is fed by a given increment to a position that is distant by one pitch. In that position, the feed plates 111a and 111b are lowered and the suction pads 114 release the piece parts 120, which are replaced on the adjacent working stages 110. It should be noted here that the feed plates 111a and 111b are urged upward and must be forced to descend by a drive mechanism such as the descending mechanism 93.

After the replacement, the piece parts 120 are subjected to press working. To this end, the feed arm 112 is moved backward by a certain distance so that the plates 112a supporting the suction pads 114 come into registry with the central positions of the respective stages 110. As a result of this movement, vacancies will form in areas that correspond to the working stages 110 and press working is effected by clamping the upper and lower parts of the second die.

After the working process is completed, the same procedure is repeated to perform the next feed cycle and, hence, the next working process.

As described above, the second die 42 is so constituted that the feed arm 42 is mounted on the lower part of the second die 42 in such a manner that it is moved forward and backward to suction-transport the piece parts. Hence, a die having a plurality of working stages can be made compact, and also the feed arm 112 is only moved to a lateral position where it does not interfere with working at the time of press working, resulting in an advantage that the feed operation for workpiece to be worked can be effectively executed.

As shown in FIG. 3, the lead working machine of the embodiment under consideration has the first die 40 and the second die 42 arranged in tandem so that the working with the first die 40 is followed by the working with the second die 42. However, as described on the foregoing pages, the work feed drive mechanism provided on the main body of the working machine enables the transport process to be performed in each die and, hence, by insuring that the feed drive mechanisms acting on the two dies are controlled in operative association with each other, continuous working can be effected with the first die 40 and the second die 42.

In the working machine of the embodiment under consideration, the feed drive mechanism has the same structural design for the portions where the respective dies are to be set and this is to insure that different kinds of products can be fabricated with this machine by working with dies that are selectively used. As for the pitch of incremental feeding and other factors that are variable with product type, the necessary adjusting means are provided on the dies and this allows the machine of the embodiment under consideration to be flexibly used in the fabrication of different kinds of products.

The transport-by-suction type die of the invention is provided with a feed mechanism such as the feed arm, etc. for succesively feeding the piece parts to the die side. Therefore, there is no necessity that the feed arm is removed to the exterior of the die, thereby being capable of making the index up. The index of the working machine depending on the conventional transport-by-suction operation is 18 to 27 spm whereas that of this embodiment can be increased to 35 to 45 spm.

Also, there is no necessity that a post is omitted in the die structure, resulting in advantages that the strength for fitting the die and the accuracy in position are improved.

Exemplary Layouts of Other Dies

Figure 8:
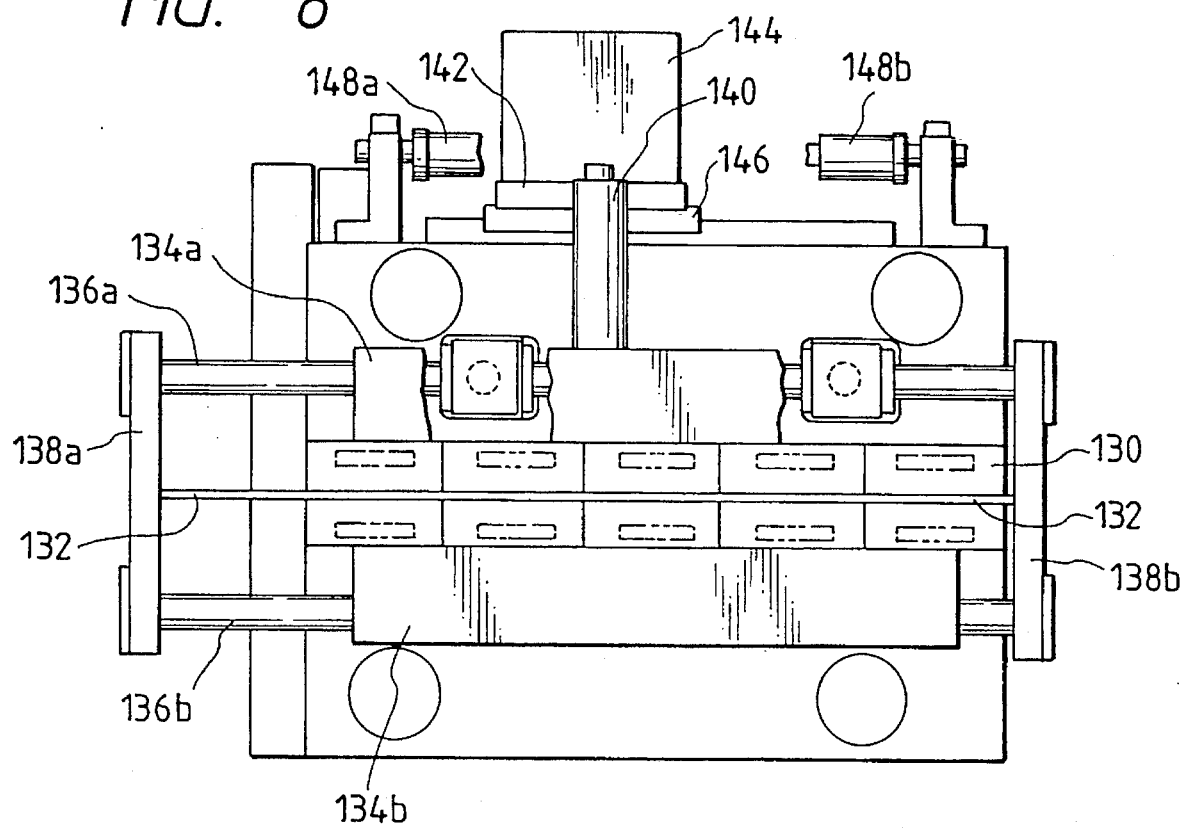
FIG. 8 is a plan view showing another exemplary die structure.
Figure 9:
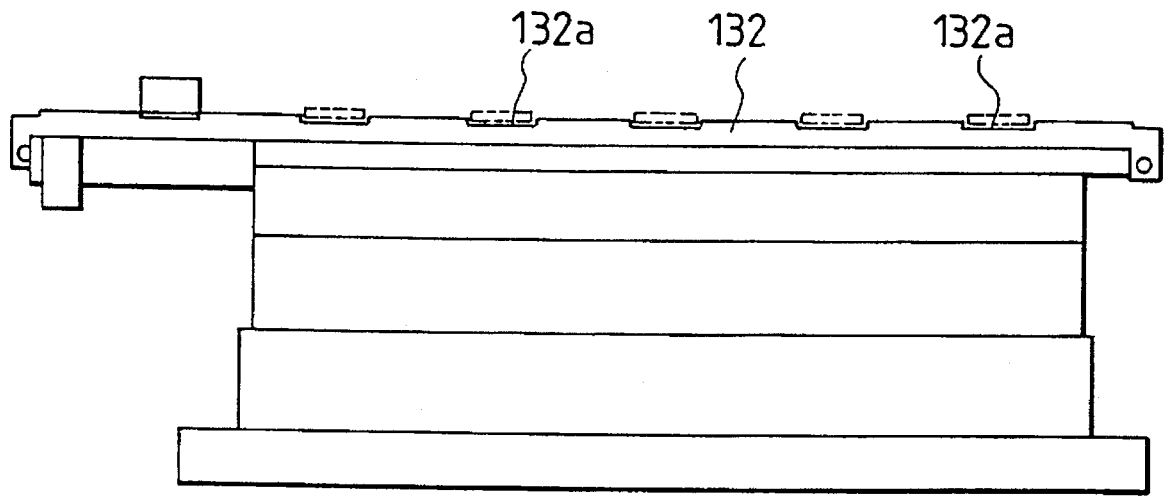
FIG. 9 is an illustration showing the construction of the feed bar used in the die shown in FIG. 8.
Figure 10:
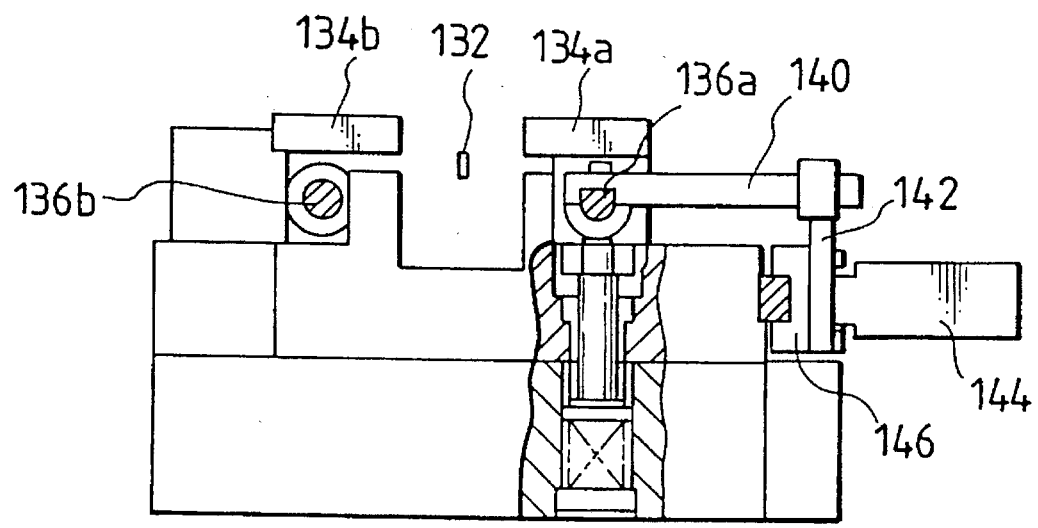
FIG. 10 is an illustration showing the feed mechanism portion of the die shown in FIG. 8.

FIGS. 8, 9 and 10 show a die of such a type that piece parts as the work are fed in given increments by means of a feed bar. FIG. 8 is a plan view of the lower part of the die which has working stages 130 provided at given intervals on the die surface as in the embodiment described above. The feed bar indicated by 132 is an elongated plate member for transporting the work (see FIG. 9) and it is provided slidably in a slit hole that runs through the entire length of the lower part of the die. The feed bar 132 has along its upper edge a plurality of pockets 132a that engage the bottom surface of the work's package. The pockets 132a are provided at the same interval as the working stages 130 in accordance with the number of the latter. Thus, the number of pockets 132a to be provided is equal to the number of the working stages plus one.

The feed bar 132 is provided such a way that it is movable not only vertically but also back and forth with respect to the die surface. When it is in the UP position, the feed bar 132 carries the work in pocket 132a and feeds it by one pitch; when it is in the DOWN position, the feed bar moves back to the initial position. Thus, the feed bar feeds the work consecutively by repeating the combined actions of vertical and horizontal movements.

To effect these actions, vertically driven feed plates 134a and 134b are provided on opposite sides of the train of working stages 130, and slide rods 136a and 136b are supported by guides beneath the feed plates 134a and 134b, respectively, and in a direction parallel to the transport of the work. The slide rods 136a and 136b are connected by plates 138a and 138b which are fixed at opposite ends. Opposite ends of each feed plate 134a or 134b are fixed to the connecting plates 138a and 138b, whereby both feed plates are supported along their length.

To have the feed bar 132 move back and forth, the slide rods 136a and 136b must be moved reciprocally. The reciprocal movements of the slide rods 136a and 136b are effected by providing a feed drive mechanism on the working machine as in the case of the embodiment described above. Stated more specifically, a horizontal pushing arm 140 extends from the central part of the length of slide rod 136a in such a direction that it departs from the operator facing the front part of the machine. A support plate 142 is fixed in a downward direction to the end portion of the pushing arm 140. A butt block 144 facing outward is fixed to the outer surface of the support plate 142. The butt block 144 is mounted at the same height as the cylinders 70a and 70b, as well as the pushers 72a and 72b. To effect guided movement of the butt block 144 along the outer lateral surface of the lower part of the die, a slide guide 146 is provided to guide and support the support plate 142.

In order to restrict the range over which the butt block 144 can move in the embodiment under consideration, shock-absorbing stoppers 148a and 148b are provided on opposite sides between which the butt block 144 is located (see FIG. 8). As the butt block 144 moves back and forth, either lateral side of the block will contact the stopper 148a or 148b, thereby restricting the position of the moving butt block 144 and, hence, the stroke of movement of the feed bar 132.

The die of the embodiment under consideration is set in the lead working machine in the same manner as shown in FIG. 3, whereupon the work can be fed consecutively by means of transport with the feed bar and subjected to the required working processes.

The sequence of working actions with the die according to the embodiment under consideration may be as follows. When effecting press working on the die surface, the feed bar 132 is located in the retracted position below the die surface. After press working, the upper part of the die ascends and, at the same time, the feed plates 134a and 134b also move up. In synchronism with these movements, the feed bar 132 is lifted and the piece parts that have been processed in the respective working stages 130 are supported by the feed bar 132 in such a way that they are placed in engagement with the pockets 132a. Subsequently, the butt block 144 is pushed by the feed drive mechanism until it contacts the stopper 148b, whereupon it stops moving. In this advanced position, the feed bar 132 is driven to descend and each of the piece parts is transferred to the next stage.

After descending into the lower part of the die, the feed bar 132 which is now in the DOWN position moves back to the initial position, where it is ready for the next transport cycle. The retraction of the feed bar 132 is effected by the feed drive mechanism on the working machine and it stops when the butt block 144 contacts the stopper 148a. Thus, the horizontal movement of the feed bar 132 combines with the vertical movements of the feed plates 134a and 134b to insure that the work is consecutively transported to the next working stage 130 so as to achieve continuous working operations.

Work Transfer Mechanism

As described above, the lead working machine of the embodiment under consideration is so adapted that various types of dies can be set in accordance with the product type. To insure such versatility or flexibility, the machine must be so designed that the product can be efficiently transferred from the first to the second die irrespective of whether the work is a leadframe or a piece part. As already mentioned, the manner in which the work is transferred from the first to the second die depends on the working program and it may be transferred to the second die either as a leadframe or as a piece part which is obtained by separating the product portion of the leadframe in the first die.

To enable transfer in either of these cases, the working machine of the embodiment under consideration has the following three elements provided intermediate between the first and the second dies: a rail mechanism for guiding the top and bottom rails of the leadframe; an ejector chute for ejecting the unwanted frame which remains after separating piece parts in the first die; and a pickup mechanism for transferring the thus separated piece part to the second die.

Figure 11:
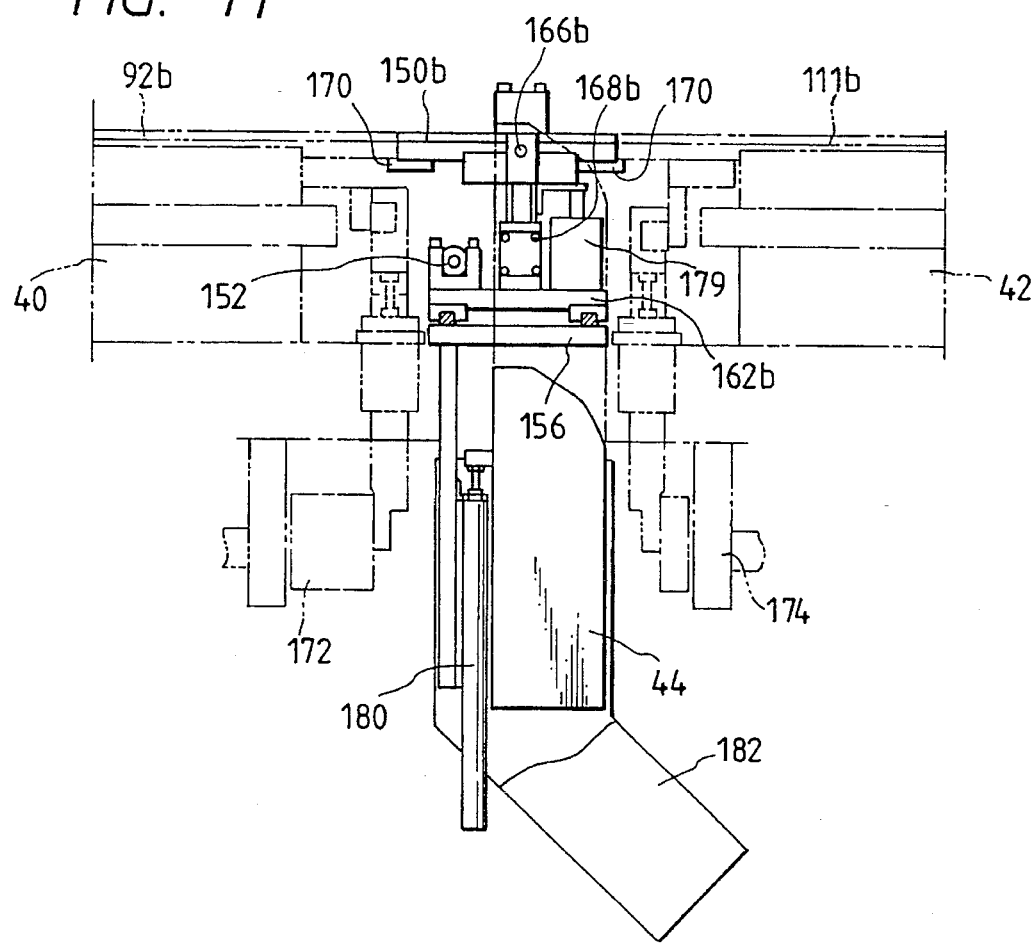
FIG. 11 is an illustration showing the layout of the rail mechanism and the ejector chute mechanism as seen from the lateral side.
Figure 12:
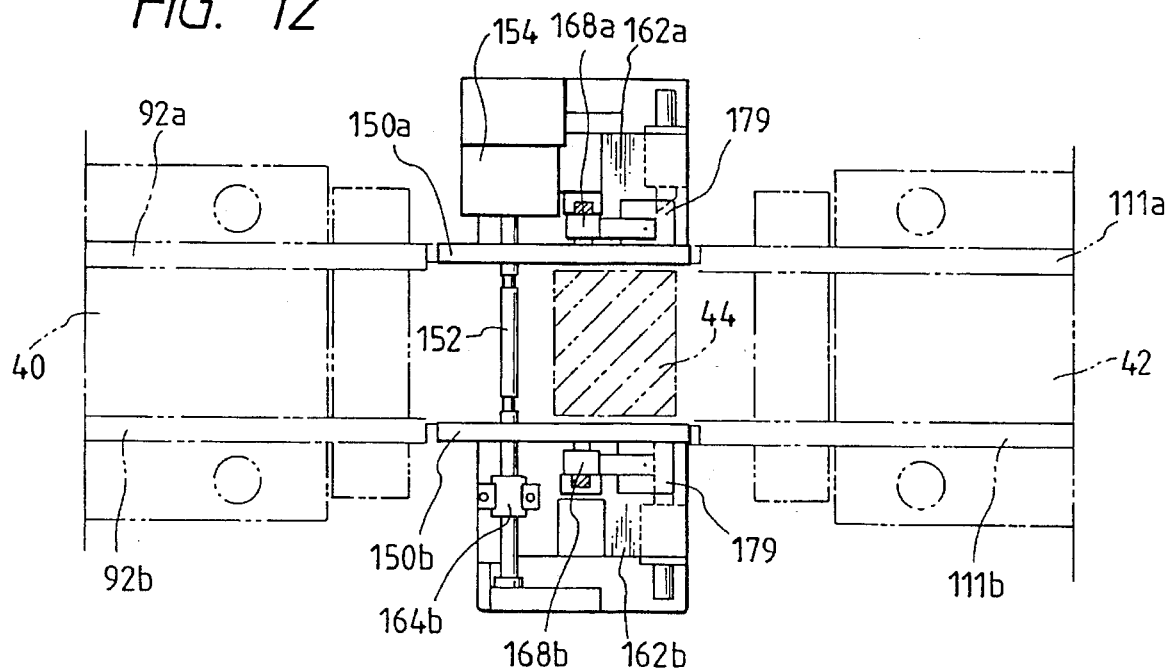
FIG. 12 is an illustration showing the layout of the rail mechanism as seen from above.

FIG. 11 is an illustration showing the layout of the components of the rail and ejector chute mechanisms as seen from the front, and FIG. 12 is a corresponding illustration as seen from above. It should be noted here that the rail mechanism is used in the case where the work is a leadframe that is transported not only on the first die but also on the second die whereas the ejector chute is used in the case of ejecting the unwanted frame portion which remains after separating piece parts in the first die. Therefore, the ejector chute is not used with a setting that performs working on the leadframe which is transported on both the first and the second dies; on the other hand, the rail mechanism is not used in the case where a piece part is to be transferred from the first to the second die.

Rail Mechanism

Referring to FIG. 12, numerals 150a and 150b represent moving rails that have grooves formed in the inner lateral surface for guiding the top and bottom rails of the leadframe and these rails are placed in a face-to-face relationship in a position intermediate between the first die 40 and the second die 42. The two rails are supported in such a way that their spacing is adjustably variable; at the same time, the rails are supported vertically movable in such a way that they will move up and down in synchronism with the movements of the feed plates 92a and 92b on the first die 40 and those of the feed plates 111a and 111b on the second die 42.

The spacing between the moving rails 150a and 150b is made variable by such a mechanism that a screw shaft 152 installed between the two rails at right angles thereto is rotated with an electric motor 154.

Figure 13:
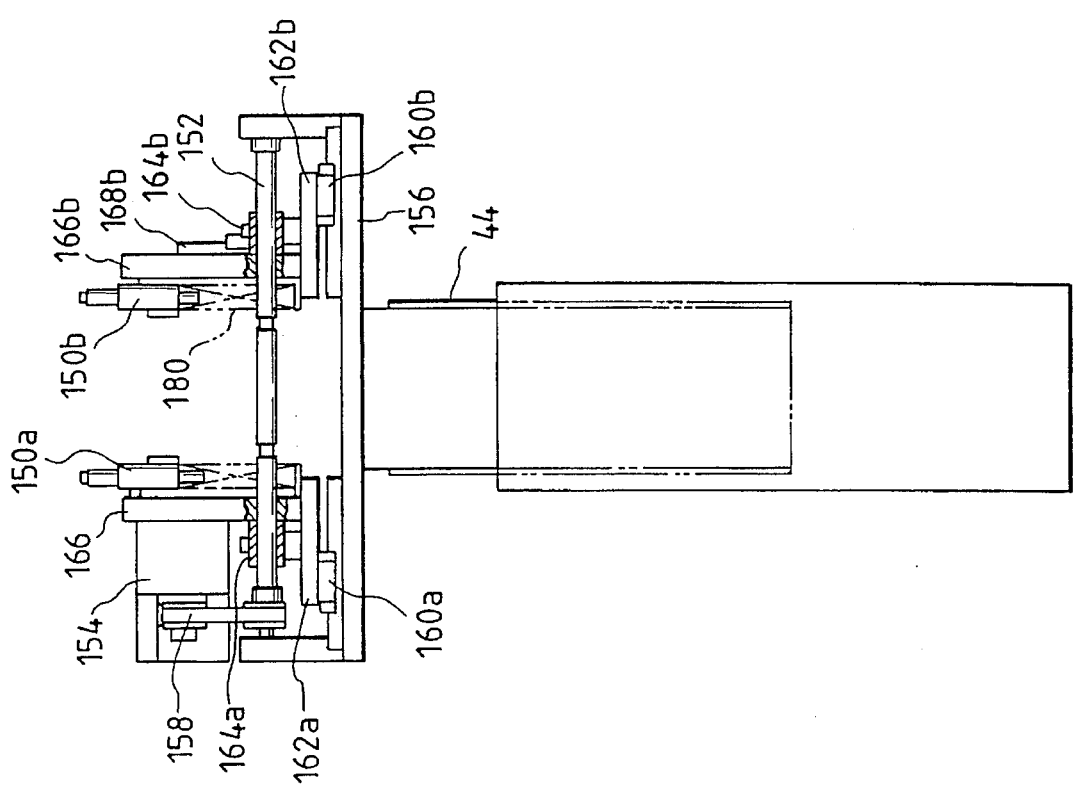
FIG. 13 is an illustration showing the layout of the rail mechanism and the ejector chute mechanism as seen from the front.

FIG. 13 shows the mechanism for adjusting the spacing between the rails 150a and 150b with the electric motor 154. In the drawing, numeral 156 refers to a fixed plate for supporting the rail mechanism. The plate 156 is fixed to the base 60. The electric motor 154 is fixed to that part of the plate 156 which is outside the rail 150a and operatively associated with the screw shaft 152 via a belt 158. The plate 156 also carries slide plates 162a and 162b which are supported to be movable in the direction of width via slide guides 160a and 160b, respectively, which guide the widthwise movements of the rails 150a and 150b. Nut elements 164a and 164b which mesh with the screw shaft 152 are fixed on to the slide plates 162a and 162b, respectively.

The screw shaft 152 is adapted to mesh with the nut elements 164a and 164b by means of inverse thread, so that the spacing between the rails 150a and 150b can be adjusted by changing the direction in which the screw shaft 152 turns.

As shown in FIG. 13, the rail 150a (or 150b) is supported by being fixed to the inner lateral surface of a support arm 166a (or 166b) which is erected on the slide plate 162a (or 162b); therefore, to adjust the spacing between the rails 150a and 150b, one may turn the screw shaft 152 with the electric motor 154, whereby the spacing between the slide plates 162a and 162b is adjusted accordingly.

The support arm 166a (or 166b) is provided with a slide guide 168a (or 168b) that permits guided vertical movements of the rail 150a (or 150b).

Each of the rails 150a and 150b has an engagement plate 170 provided on the underside at either end as shown in FIG. 11, and one engagement plate engages an end of each of the feed plates 92a and 92b on the first die 40 and the other engagement plate engages an end of each of the feed plates 111a and 111b on the second die 42. Because of this arrangement, the rails 150a and 150b will descend in synchronism with the descending movement of the feed plates 92a, 92b, 111a and 111b.

Shown by 172 (or 174) is a mechanism for lowering the feed plates provided on the first die 40 (or 42). The mechanism 172 (or 174) actuates the forced lowering of the feed plates 92a and 92b (or 111a and 111b) in synchronism with the consecutive feed of the work. In response to the vertical movements of the feed plates 92a, 92b, 111a and 111b, the rails 150a and 150b move up and down to effect the precise guided transfer of the leadframe.

The rails 150a and 150b are returned to the UP position by the resilience of a spring 180 (see FIG. 13). The spring 180 may be replaced by a drive element such as an air cylinder.

As described above, the rail mechanism of the embodiment under consideration has the moving rails 150a and 150b provided in a position between the first die 40 and the second die 42 and the product is transported with the spacing between the rails being adjusted in accordance with the product type. Because of this arrangement, the working machine of the invention is applicable to a broad range of product types. Further, the rails 150a and 150b are allowed to move up and down in response to the vertical movements of the feed plates 92a, 92b, 111a and 111b and this enables the work to be transferred continuously from the first die 40 to the second die 42, thereby accomplishing continuous working with the machine.

As already mentioned, the rails 150a and 150b are brought into engagement with the feed plates 92a and 92b on the first die 40, as well as with the feed plates 111a and 111b on the second die 42 by means of the engagement plates 170 when a working operation is conducted. However, when replacing the dies, the rails 150a and 150b must be disengaged not only from the first die 40 but also from the second die 42 in order to provide ease in die replacement and setting operations. To this end, the machine of the embodiment under consideration has an air cylinder 179 provided below the rails 150a and 150b (see FIG. 11) so that they can be lowered from the engagement position before die replacement is started.

Ejector Chute Mechanism

In FIG. 11, numeral 44 refers to the ejector chute for ejecting the unwanted frame out of the first die 40. As shown, the ejector chute 44 is provided in a vertically movable manner in a position intermediate between the rails 150a and 150b. The ejector chute 44 is formed as a tube having a rectangular cross section and has an inlet provided on the side where the unwanted frame is admitted. Shown by 180 is an air cylinder that causes the ejector chute 44 to be moved up and down. As shown in FIG. 11, the ejector chute 44 is used as it is set either in the DOWN position where the upper end of the chute is located below the support plate 156 or in the UP position where the inlet of the chute is located generally at the same height as the feed plates 92a and 92b on the first die 40.

Shown by 182 is an ejection guide that is positioned below the chute 44. The guide 182 receives the unwanted frame as it drops down the chute 44 and sends it into a scrap box. The guide 182 is fitted over the chute 44 and its lower part is inclined toward the scrap box.

In the case of working a leadframe as it is transported between the first die 40 and the second die 42, the ejector chute 44 is lowered to the DOWN position which is the retracted position where the chute will not interfere with the movement of the rails 150a and 150b. If the first die 40 is of a type that separates the product portion from the leadframe, the chute is set in the UP position.

If the first die is of such a type that the leadframe is subjected to the necessary working processes with the product portions being then separated in piece parts, the unwanted frames are ejected as the supplied leadframes are successively transported. The ejector chute 44 admits through the inlet the unwanted frames as they are ejected from the first die and the admitted frames slide down the guide 182 to be discharged into the scrap box.

Thus, the unwanted frames can be easily ejected between the first die 40 and the second die 42 without affecting the layout of the two dies.

Pickup Mechanism

We will now describe the pickup mechanism for transferring a piece part from the first die 40 to the second die 42. The pickup mechanism of the embodiment under consideration uses suction pads to suck pneumatically the piece part that has been transported to the ejection end of the first die 40; the pickup mechanism then lifts the piece part and moves it to a position above the second die 42, followed by replacement on the die surface of the latter.

Figure 14:
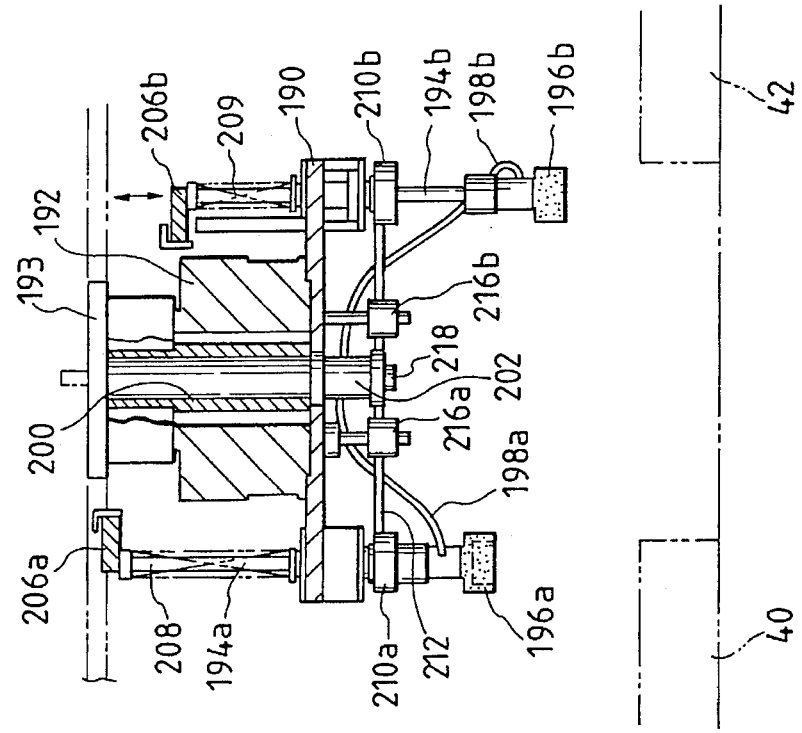
FIG. 14 is an illustration showing the layout of the pickup mechanism as seen from the lateral side.

To effect these actions, a rotating plate 190 is provided above a position intermediate between the first die 40 and the second die 42 in such a way that the plate is driven to rotate in a horizontal plane by means of a servo motor 192 (see FIG. 14). The rotating plate 190 is furnished with a suction mechanism for supporting piece parts by suction. The servo motor 192 is mounted, with its face down, to a base plate 193 and the rotating plate 190 is fixed to its bottom end surface.

The suction mechanism has moving rods 194a and 194b that are mounted to the rotating plate 190 in a vertically movable manner, as well as suction pads 196a nd 196b that are mounted to the lower ends of the moving rods 194a and 194b, respectively. It should be noted that the moving rods 194a and 194b are mounted to the rotating plate 190 in such a way that they are capable of not only vertical movements but also free rotation about their own axis. Air is connected to the suction pad 196a (or 196b) via an air tube 198a (or 198b) which is connected at one end to the pad 196a (or 196b) and which communicates at the other end to an air supply through a pipe 200 that is fixed, with its face down, to the base plate 193.

The servo motor 192 used in the embodiment under consideration has a through-hole formed in the central portion, through which the fixed pipe 200 is inserted (see FIG. 14). The air tubes 198a and 198b are connected to the fixed pipe 200 by means of a rotary air joint 202 so that the tubes will not interfere with the rotation of the suction mechanism.

Figure 15:
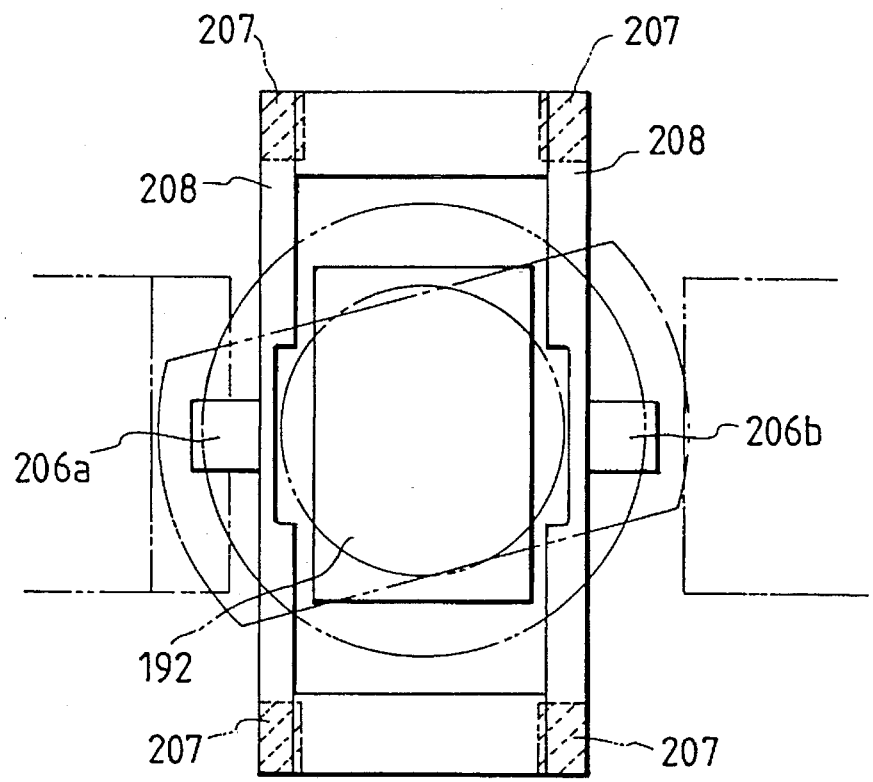
FIG. 15 is an illustration showing the portion that drives the pushing plates in the pickup mechanism.

To drive the moving rod 194a (or 194b) vertically, a pushing plate 206a (or 206b) is placed in contact with its top end surface and the plate 206a (or 206b) is driven vertically by means of an air cylinder. FIG. 15 illustrates how the pushing plates 206a and 206b are pushed by air cylinders 207. In FIG. 15, numeral 208 refers to a pushing arm that has the pushing plate 206a (or 206b) fixed to the central part of its length. The pushing arms 208 are supported in a vertically movable manner above opposing sides between which the servo motor 192 is located, and the drive rod of air cylinder 207 is fixed to both ends of each pushing arm 208. Extending the drive rods of the air cylinders 207 causes the plates 206a and 206b to be pushed out. It should be mentioned here that the rod 194a (or 194b) is moved upward by the resilience of a spring 209 that is fitted over the rod.

Figure 16:
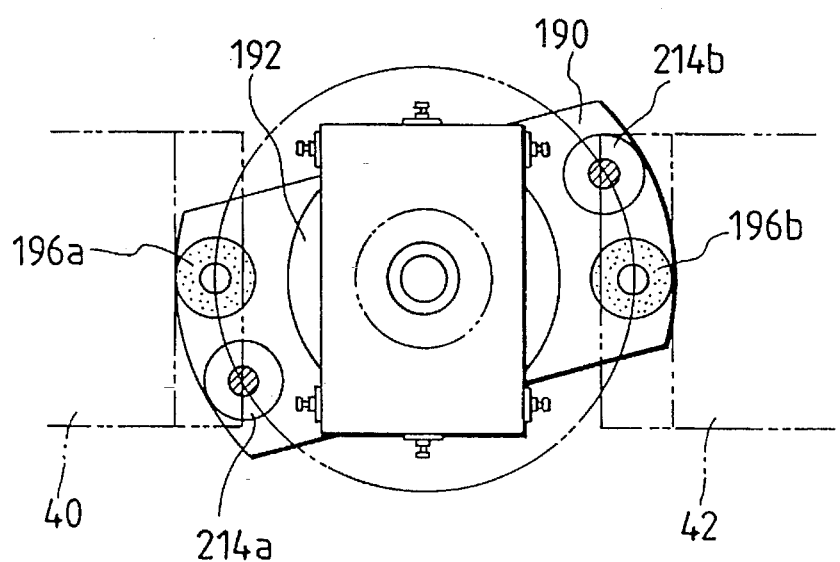
FIG. 16 is an illustration showing the layout of the suction mechanism in the pickup mechanism.

FIG. 16 shows the rotating plate 190 and the positions of suction pads 196a and 196b relative to the plate 190 as they are seen from above. The suction pads 196a and 196b are so designed that they will transfer piece parts from the first die 40 to the second die 42 each time the rotating plate 190 turns for 180°. To this end, the pads are arranged symmetrically with respect to the center of the plate 190 (see FIG. 16) and they are spaced apart in such a way that when one of them is located above the position of ejection from the first die 40, the other pad is located above the position of supply to the second die 42. With a pair of suction mechanisms being thusly arranged symmetrically with respect to the center of the plate 190, each turning of the plate 190 for 180° causes the positions of the suction pads 196a and 196b to reverse so that the piece part as carried by the first die 40 is transferred on to the second die 42.

It should be noted that when the piece part is transferred from the first die 40 for replacement on the second die 42, the orientation of the work may remain the same or it may be changed by 90°. This is because some products require that a specified direction be selected for the consecutive feed of the piece parts on the working stages. The machine of the embodiment under consideration is furnished with a mechanism that enables the selection of such specified directions.

Turning back to FIG. 14, numerals 210a and 210b refer to pulleys that are fixed to the moving rods 194a and 194b, respectively, below the rotating plate 190. A belt 212 is wound around the pulleys 210a and 210b so that when the rotating plate 190 turns, it rotating action is utilized to have the rods 194a and 194b rotate about their own axis.

Figure 17:
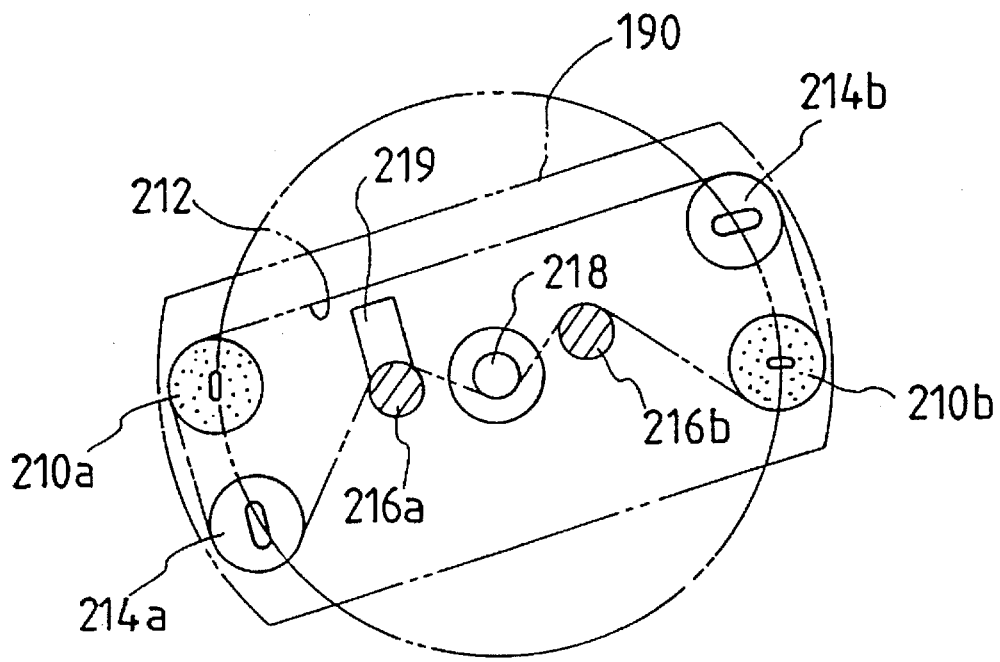
FIG. 17 is an illustration showing a first method of winding a belt around pulleys and the like in the pickup mechanism.
Figure 18:
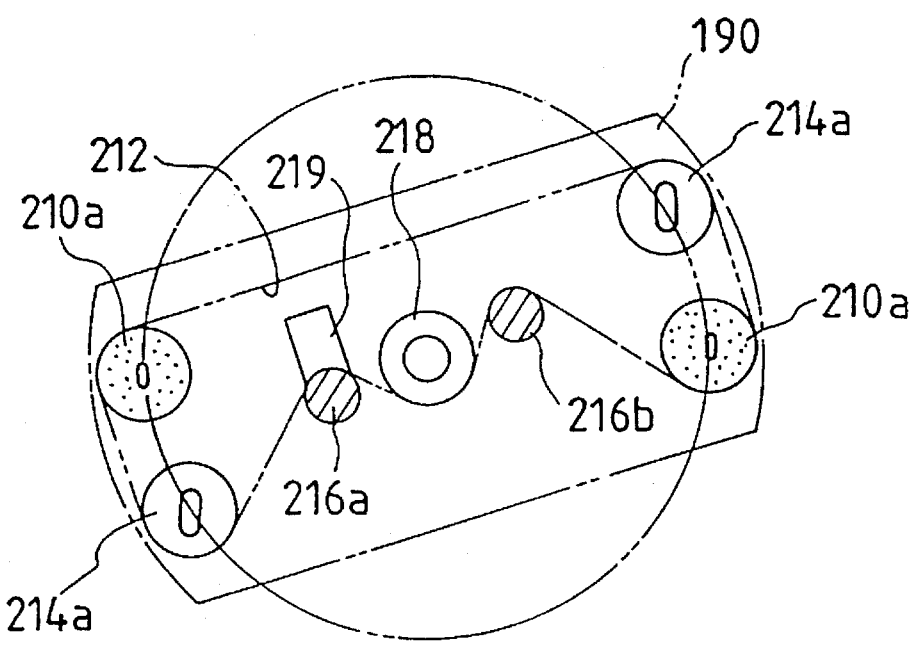
FIG. 18 is an illustration showing a second method of winding a belt around pulleys and the like in the pickup mechanism.
Figure 19:
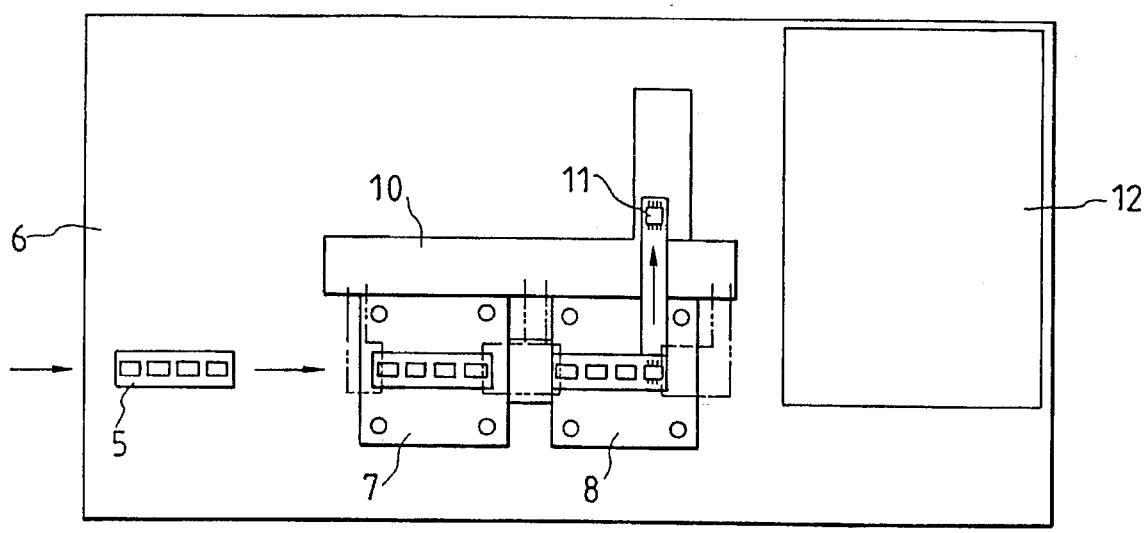
FIG. 19 is an illustration showing the construction of a prior art lead working machine.
Figure 20:
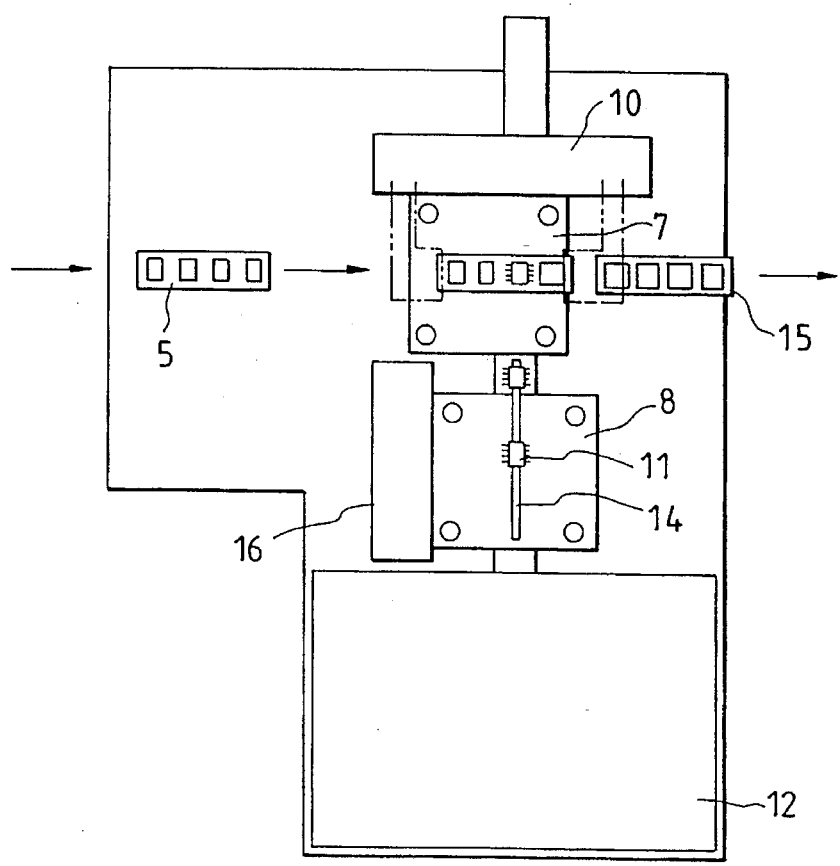
FIG. 20 is an illustration showing the construction of another prior art lead working machine.
Figure 21:
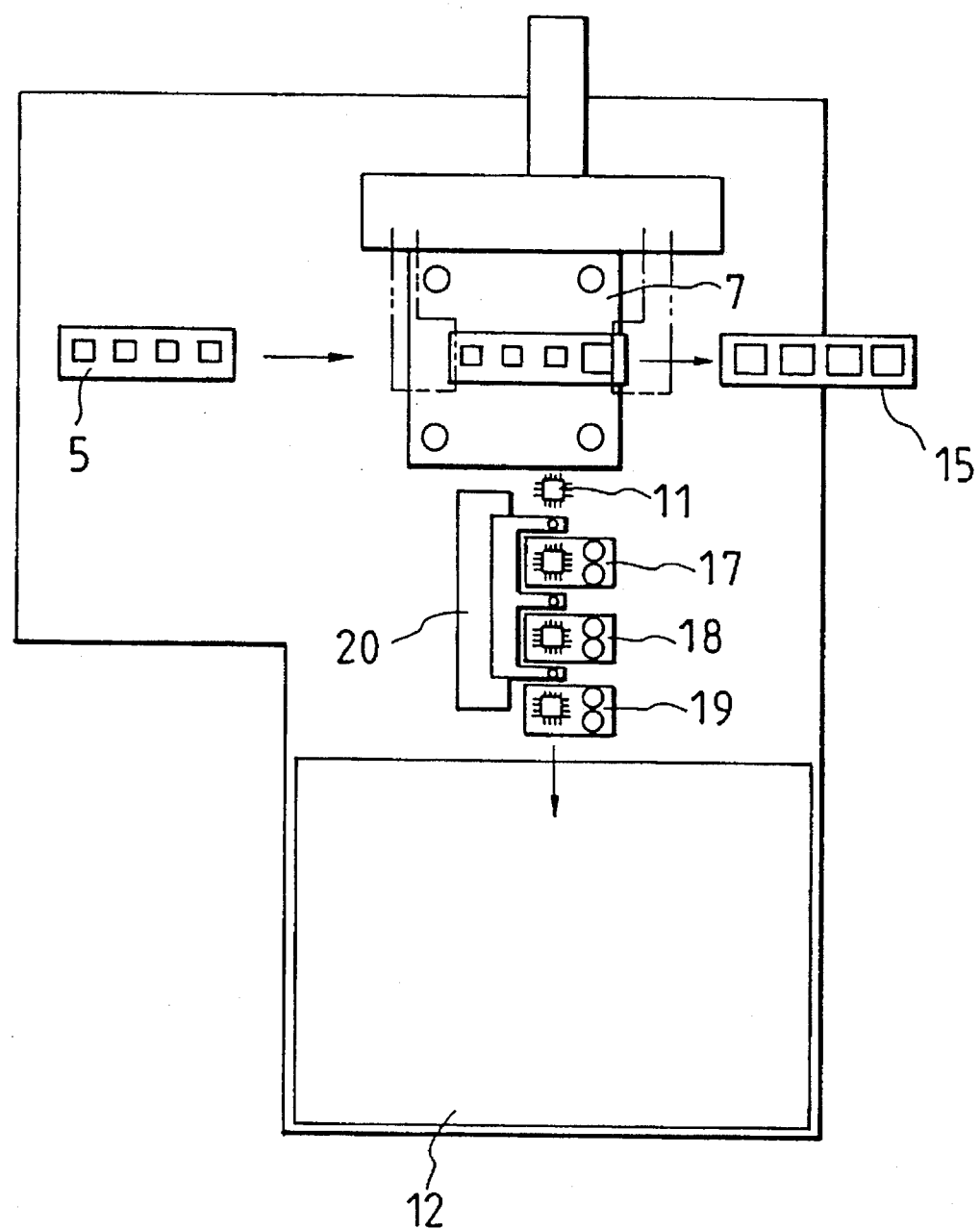
FIG. 21 is an illustration showing the construction of yet another prior art working machine.

FIGS. 17 and 18 illustrate the layout of the pulleys 210a and 210b on the rotating plate 190, as well as the layout of first pulleys 214a and 214b, second pulleys 216a and 216b, and a fixed pulley 218 that are positioned on the plate 190. The fixed plate 198 penetrates the center of the plate 190 to be fixed to the bottom end of the fixed pipe 200. In other words, the pulley 218 is fixed to the machine frame and the plate 190 is capable of turning with respect to the pulley 218.

What is unique about the fixed pulley 218 is that it consists of two parts, one being the smaller-diameter pulley and the other being the larger-diameter pulley. The circumference of the smaller-diameter pulley is one half the circumference of each of the pulleys 210*a* and 210*b*, whereas the circumference of the larger-diameter pulley is equal to that of the pulleys 210*a* and 210*b*. As shown, the first pulley 214*a* (or 214*b*) is generally positioned side by side with respect to the pulley 210*a* (or 210*b*), and the second pulleys 216*a* and 216*b* are positioned diametrically and symmetrically with respect to the center of the fixed pulley 218, to which they are close.

FIGS. 17 and 18 both illustrate how the belt 212 is wound around the pulleys 210*a* and 210*b*, the first pulleys 214*a* and 214*b*, as well as other pulleys. The difference between the two figures is that in FIG. 17, the belt 212 is pressed against the smaller-diameter portion of the fixed pulley 218 whereas in FIG. 18, the belt is pressed against the larger-diameter portion of the pulley 218. By turning plate 190 for 180°, the piece part is replaced on the second die with its orientation either changed by 90° (in the case shown in FIG. 17) or unchanged (FIG. 18) from the case where it was picked up from the first die. Thus, the machine of the embodiment under consideration permits the piece part to be replaced on the second die in two different orientations by changing the manner in which the belt 212 is applied and, hence, the operator may select a suitable method of belt application in accordance with the desired product type.

In the machine of the embodiment under consideration, the length of the belt 212 is readjusted by sliding a plate 219 after belt replacement.

It should also be noted that if the rotating plate 190 is turned in the reverse direction, the piece part can be replaced on the second die with its orientation being changed by –90° (–270°). If the belt is not pressed against any part of the fixed pulley 218, a 180° change in orientation is possible.

As described above, the pickup mechanism moves the work from the first die and replaces it on the second die by coordinating the rotating motion of the plate 190, the vertical movements of the rods 194*a* and 194*b*, and the sucking action of the pads 196*a* and 196*b*. Stated more specifically, the piece part ejected from the first die is supported by the sucking action of the pad 196*a* provided at the end of the descending rod 194*a*; after the rod 194*a* ascends, the plate 190 turns for 180° so that the rod 194*a* moves to a point above the second die 42; subsequently, the rod 194*a* is lowered and the piece part is released from the pad 196*a* and replaced on the second die 42; in this transfer mode, the other pad 196*b* is located above the first die 40 and in the process of supporting the next piece part by suction.

Thus, each time the plate 190 turns for 180°, the piece part is picked up from the first die 40 by suction and replaced on the second die 42.

As described above, the pickup mechanism of the embodiment under consideration moves the piece part from the first die and replaces it on the second die each time the plate 190 is turned for 180°. This contributes to efficient movement and replacement of the work, thereby proving effective in shortening the cycle time of the operation of moving and replacing the work. Further, a compact mechanism can be designed for moving and replacing the work and this feature is particularly advantageous when dies are to be set close to each other as in the case of the embodiment under consideration. Another possibility is the selection of the orientation of the work during its movement and replacement (it may be changed or unchanged in orientation from the case where it was picked up from the first die) and this can be effectively utilized in increasing the flexibility of lead working machines.

Product Receiving Mechanism Portion

The product that has passed through all the steps of working with the second die 42 is received by a receiving tray in the receiving mechanism portion C. As shown in FIG. 2, the receiving pickup head 52 in the receiving mechanism portion C sucks piece parts as they are transported from the second die 42 and replaces them in order into the receiving tray. As already mentioned, there are two different cases of working with the second die 42; in one case, piece part are fed for working with the second die and, in the other case, the leadframe is transported from the first die 40 to the second die 42, where it is worked and finally piece parts are separated from the worked leadframe. In the second case, the unwanted frame is ejected from the second die 42. To cope with this situation, an ejector chute 220 is fixed at the delivery end of the second die 42 as shown in FIG. 3 and each piece part is picked up with the receiving pickup head 52 and replaced in the receiving tray whereas the unwanted frame is discharged from the machine through the ejector chute 220. The upper and lower positions of the ejector chute 220 are fixed.

As described on the foregoing pages, the general-purpose lead working machine of the invention is adapted for flexible use in working different types of products and to meet this need, the structures of dies are made common to various product types and so are the constructions of the feed drive mechanisms provided on the main body of the machine and, at the same time, a rail mechanism, an ejector chute mechanism and a pickup mechanism are mounted between dies. Because of these two features, the working machine of the invention can be used irrespective of whether the work is fed as a leadframe, in piece parts or the like.

Thus, the dies to be set as the first and second dies may be selected as appropriate to product types such as DIP or PLCC.

In the actual lead working machine, control parameters such as the timing of driving the feed drive mechanisms and other elements vary from one die to another and, hence, the machine is so adapted that the control program associated with a particular die that has been set in the machine is automatically read to perform control with a computer. The machine is also adapted in such a way that a die can be set in a predetermined position by placing it on the base 60 on the side closer to the operator and pushing it to slide toward the other side of the machine. When the die is set properly, it will contact the electric circuits and control circuits such as air piping in the main body of the machine to establish the intended connections automatically.

The above-described machine has two units set in the working and handling portion B. If a great number of working steps are involved in the fabrication of semiconductor devices, three or more die units may be arranged in tandem. In this case, too, a transfer mechanism of the same construction as described above may be provided between adjacent dies so that the machine can be utilized in the working of various types of products.

As described on the foregoing pages, the transport-by-suction type die of the invention has a guide mechanism provided for sucking piece parts and feeding them consecutively and this feature proves effective in increasing the indexing speed for transporting the piece parts by suction.

Further, there is not need to manufacture dies to different specifications even if more than one working process is involved and this provides ease in die manufacture. As another advantage, the feed arm moves back and forth over the die but need not be retracted to a position exterior to the die and, hence, piece parts can be efficiently transported by suction. What is more, if the feed arm is shaped like a frame, it can be moved without vibrations and, hence, piece parts can be fed consecutively in a positive manner.

Although the present invention has been fully described by way of the preferred embodiments thereof with reference to the accompanying drawings, various changes and modifications will be apparent to those having skill in this field. Therefore, unless these changes and modifications otherwise depart from the scope of the present invention, they should be construed as included therein.

What is claimed is:

1. A transport-by-suction die for use in a working machine having a plurality of working stages spaced apart at preset intervals and for carrying out working processes, said die comprising:

a feed arm mounted in a position above the working stages in a lower part of said die and operative to slide back and forth in a direction of consecutive feed and vertically movable with respect to a surface of the working stages;

suction pads for supporting a piece part by suction, said suction pads being attached to said feed arm at intervals corresponding to the preset intervals of said working stages;

a negative-pressure aspiration mechanism connected with each of said suction pads;

a drive mechanism for causing said feed arm to move vertically and back and forth in synchronism with operation of the working processes, said drive mechanism comprising a feed drive mechanism provided exteriorly of said die for allowing said feed arm to move back and forth in the direction of consecutive feed; and a slide guide means for supporting said feed arm in a direction parallel to the direction of consecutive feed and on a lateral surface of the opposite side of the lower part;

wherein said feed arm comprises a sub-arm which extends toward the opposite side of the lower part of said die, and a butt block that is to be pushed by said feed drive mechanism so as to reciprocate said feed arm by said feed drive mechanism, said butt block being operative to move back and forth only in the direction of consecutive feed.

2. A transport-by-suction die as claimed in claim 1, wherein said feed arm comprises support plates on which said suction pads are provided, said support plates being positioned in areas between adjacent working stages that will not interfere with the working processes.

3. A transport-by-suction die as claimed in claim 1, wherein said feed arm is formed as a frame-like element having support plates and which defines rectangular openings in areas that will correspond to the working stages during a working process and the support plates of the feed arm will be positioned in areas between adjacent working stages that will not interfere with the working processes.

\* \* \* \* \*